United States Patent
Fu

(10) Patent No.: US 11,581,364 B2
(45) Date of Patent: Feb. 14, 2023

(54) DISPLAY PANEL, PREPARATION METHOD THEREOF, AND DISPLAY DEVICE

(71) Applicant: Hubei Yangtze Industrial Innovation Center Of Advanced Display Co., Ltd., Wuhan (CN)

(72) Inventor: Jujian Fu, Shanghai (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 53 days.

(21) Appl. No.: 17/218,144

(22) Filed: Mar. 30, 2021

(65) Prior Publication Data
US 2021/0217808 A1 Jul. 15, 2021

(30) Foreign Application Priority Data
Dec. 25, 2020 (CN) .......................... 202011566865.6

(51) Int. Cl.
| | | |
|---|---|---|
| H01L 27/15 | (2006.01) | |
| G09G 3/32 | (2016.01) | |
| H01L 33/00 | (2010.01) | |

(52) U.S. Cl.
CPC ............. *H01L 27/156* (2013.01); *G09G 3/32* (2013.01); *H01L 33/005* (2013.01); *G09G 2320/0233* (2013.01)

(58) Field of Classification Search
None
See application file for complete search history.

(56) References Cited

U.S. PATENT DOCUMENTS

| | | | | |
|---|---|---|---|---|
| 2004/0119676 | A1* | 6/2004 | Nam .................... | G09G 3/3648 345/87 |
| 2009/0066259 | A1* | 3/2009 | Hwang ................. | H01L 27/322 445/24 |
| 2010/0141874 | A1* | 6/2010 | Morita .............. | G02F 1/133514 349/187 |
| 2012/0293473 | A1* | 11/2012 | Lee .......................... | G09G 5/00 345/207 |
| 2019/0305000 | A1* | 10/2019 | Lin ....................... | H01L 27/124 |

* cited by examiner

*Primary Examiner* — Nitin Patel
*Assistant Examiner* — Amen W Bogale
(74) *Attorney, Agent, or Firm* — Kilpatrick Townsend & Stockton LLP

(57) ABSTRACT

A preparation method of a display panel includes: forming multiple compensation groups on a substrate to obtain an array substrate, where the multiple compensation groups include at least first compensation group and second compensation group, and brightness difference of light-emitting elements of same light-emitting color in the first compensation group and the second compensation group under a same gray scale is larger than a preset value; calculating thicknesses of first color film layer, second color film layer and third color film layer corresponding to each of the multiple compensation groups respectively; forming the first color film layer, the second color film layer and the third color film layer on light-emitting side of the first light-emitting element, the second light-emitting element, and the third light-emitting element respectively according to the thicknesses of the first color film layer, the second color film layer and the third color film layer obtained by calculation.

19 Claims, 12 Drawing Sheets

Form multiple compensation groups on a substrate to obtain an array substrate; where each of the multiple compensation groups includes at least one pixel unit, each of the at least one pixel unit includes a first light-emitting element, a second light-emitting element and a third light-emitting element, and light-emitting colors are different among the first light-emitting element, the second light-emitting element and the third light-emitting element; the multiple compensation groups include at least a first compensation group and a second compensation group, and a brightness difference of light-emitting elements of a same light-emitting color in the first compensation group and the second compensation group under a same gray scale is larger than a preset value ~S11

Calculate thicknesses of a first color film layer, a second color film layer and a third color film layer which correspond to each of the multiple compensation groups, respectively, where the first color film layer is located on a light-emitting side of the first light-emitting element, the second color film layer is located on a light-emitting side of the second light-emitting element, and the third color film layer is located on a light-emitting side of the third light-emitting element ~S12

Form the first color film layer on the light-emitting side of the first light-emitting element, form the second color film layer on the light-emitting side of the second light-emitting element, and form the third color film layer on the light-emitting side of the third light-emitting element according to the thicknesses of the first color film layer, the second color film layer and the third color film layer obtained in the S12 ~S13

FIG. 1

Acquire a test brightness and a target brightness of the first light-emitting element, a test brightness and a target brightness of the second light-emitting element, and a test brightness and a target brightness of the third light-emitting element in each of the multiple compensation groups —— S21

Calculate to obtain the thickness of the first color film layer according to a color film layer thickness calculation formula, the test brightness and the target brightness of the first light-emitting element in each of the multiple compensation groups, and a unit thickness transmittance of the first color film layer; calculate to obtain the thickness of the second color film layer according to the color film layer thickness calculation formula, the test brightness and the target brightness of the second light-emitting element in each of the multiple compensation groups, and a unit thickness transmittance of the second color film layer; and calculate and obtain the thickness of the third color film layer according to the color film layer thickness calculation formula, the test brightness and the target brightness of the third light-emitting element in each of the multiple compensation groups, and a unit thickness transmittance of the third color film layer —— S22

FIG. 3

Acquire a sub-test brightness and a sub-target brightness of the first light-emitting element, a sub-test brightness and a sub-target brightness of the second light-emitting element, and a sub-test brightness and a sub-target brightness of the third light-emitting element in each of the multiple compensation groups under a first pure color picture, a second pure color picture and a third pure color picture respectively —— S31

Use a sum of a sub-test brightness of the light-emitting elements of the same color under the first pure color picture, the second pure color picture and the third pure color picture as a test brightness of the light-emitting elements of the same color; and use a sum of a sub-target brightness of the light-emitting elements of the same color under the first pure color picture, the second pure color picture and the third pure color picture as a target brightness of the light-emitting elements of the same color —— S32

FIG. 4

Control the array substrate to display the first pure color picture; test and obtain the sub-test brightness and a test color coordinate of the first light-emitting element, the sub-test brightness and a test color coordinate of the second light-emitting element, and the sub-test brightness and a test color coordinate of the third light-emitting element in each of the multiple compensation groups under the first pure color picture; acquire a target brightness and a target color coordinate of a pixel unit preset in the first pure color picture respectively; and calculate to obtain the sub-target brightness of the first light-emitting element, the sub-target brightness of the second light-emitting element, and the sub-target brightness of the third light-emitting element in each of the multiple compensation groups under the first pure color picture according to a sub-target brightness calculation formula, the test color coordinate of the first light-emitting element, the test color coordinate of the second light-emitting element, and the test color coordinate of the third light-emitting element in each of the multiple compensation groups under the first pure color picture, and the target brightness and the target color coordinate of the pixel unit ~S111

Obtain the sub-test brightness and the sub-target brightness of the first light-emitting element, the sub-test brightness and the sub-target brightness of the second light-emitting element, and the sub-test brightness and the sub-target brightness of the third light-emitting element in each of the multiple compensation groups under the second pure color picture according to the method of the S111; and obtain the sub-test brightness and the sub-target brightness of the first light-emitting element, the sub-test brightness and the sub-target brightness of the second light-emitting element, and the sub-test brightness and the sub-target brightness of the third light-emitting element in each of the multiple compensation groups under the third pure color picture according to the method of the S111 ~S112

FIG. 5

Acquire a test brightness and a target brightness of the first light-emitting element, a test brightness and a target brightness of the second light-emitting element, and a test brightness and a target brightness of the third light-emitting element in each of the multiple compensation groups —S21

In a case where a thickness ratio of the first color film layer and the second color film layer and a thickness ratio of the second color film layer and the third color film layer corresponding to the first pixel unit, and a thickness ratio of the first color film layer and the second color film layer and a thickness ratio of the second color film layer and the third color film layer corresponding to the second pixel unit are unchanged, adjust the thicknesses of the first color film layer, the second color film layer and the third color film layer, where thickness adjustment amounts of the first color film layer, the second color film layer and the third color film layer in the first pixel unit are respectively less than thickness adjustment amounts of color film layers of a same color in the second pixel unit —S23

Calculate to obtain the thickness of the first color film layer according to a color film layer thickness calculation formula, the test brightness and the target brightness of the first light-emitting element in each of the multiple compensation groups, and a unit thickness transmittance of the first color film layer; calculate to obtain the thickness of the second color film layer according to the color film layer thickness calculation formula, the test brightness and the target brightness of the second light-emitting element in each of the multiple compensation groups, and a unit thickness transmittance of the second color film layer; and calculate to obtain the thickness of the third color film layer according to the color film layer thickness calculation formula, the test brightness and the target brightness of the third light-emitting element in each of the multiple compensation groups, and a unit thickness transmittance of the third color film layer —S22

FIG. 7

DISPLAY PANEL, PREPARATION METHOD THEREOF, AND DISPLAY DEVICE

CROSS-REFERENCE TO RELATED APPLICATIONS

This application claims priority to Chinese Patent Application No. 202011566865.6 filed Dec. 25, 2020, the disclosure of which is incorporated herein by reference in its entirety.

FIELD

Embodiments of the present disclosure relate to the field of display technology and, in particular, to a display panel, a preparation method of the display panel, and a display device.

BACKGROUND

The micro light emitting diode (Micro-LED) display technology is a display technology that a traditional light emitting diode (LED) is miniaturized and matrix-formed, and a complementary metal oxide semiconductor (CMOS) integrated circuit is adopted to manufacture a driver circuit, so that the addressing and independent driving of each pixel point are achieved. The Micro-LED adopted in this technology has the advantages of being capable of emitting light automatically, simple in structure, low in power consumption, small in size and the like, and becomes a research hotspot in the display field.

In the related art, the Micro-LED is transferred onto a circuit substrate to form a Micro-LED display panel. In order to save the transfer cost, a batch transfer technology is generally adopted, that is, simultaneous transfer of multiple Micro-LEDs is carried out by using an area on a wafer as a unit. Due to the influences of preparation process errors, transfer errors, electric connection structure differences and the like, even if Micro-LEDs in a same area on a same wafer are transferred into the circuit substrate, the brightness and chromaticity of the Micro-LEDs are visually different, and thus the display uniformity of the display panel is poor.

SUMMARY

The present disclosure provides a display panel, a preparation method of the display panel, and a display device, to improve the display uniformity of the display panel.

In one embodiment of the present disclosure provides a preparation method of a display panel. The method includes described below.

S11: multiple compensation groups are formed on a substrate to obtain an array substrate; where each of the multiple compensation groups includes at least one pixel unit, each of the at least one pixel unit includes a first light-emitting element, a second light-emitting element and a third light-emitting element, and light-emitting colors are different among the first light-emitting element, the second light-emitting element and the third light-emitting element; the multiple compensation groups include at least a first compensation group and a second compensation group, and a brightness difference of light-emitting elements of a same light-emitting color in the first compensation group and the second compensation group under a same gray scale is larger than a preset value.

S12: thicknesses of a first color film layer, a second color film layer and a third color film layer which correspond to each of the multiple compensation groups are calculated, respectively, where the first color film layer is located on a light-emitting side of the first light-emitting element, the second color film layer is located on a light-emitting side of the second light-emitting element, and the third color film layer is located on a light-emitting side of the third light-emitting element.

S13: the first color film layer is formed on the light-emitting side of the first light-emitting element, the second color film layer is formed on the light-emitting side of the second light-emitting element, and the third color film layer is formed on the light-emitting side of the third light-emitting element according to the thicknesses of the first color film layer, the second color film layer and the third color film layer obtained in the S12.

An embodiment of the present disclosure further provides a display panel, prepared by the preparation method of the display panel described in the above embodiments. The display panel includes a substrate and multiple compensation groups located on the substrate, each of the multiple compensation groups includes at least one pixel unit, where each of the at least one pixel unit includes a first light-emitting element, a second light-emitting element and a third light-emitting element, and light-emitting colors are different among the first light-emitting element, the second light-emitting element and the third light-emitting element; a first color film layer is arranged on a light-emitting side of the first light-emitting element, a color of the first color film layer is the same as a light-emitting color of the first light-emitting element; a second color film layer is arranged on a light-emitting side of the second light-emitting element, and a color of the second color film layer is the same as a light-emitting color of the second light-emitting element; a third color film layer is arranged on a light-emitting side of the third light-emitting element, and a color of the third color film layer is the same as a light-emitting color of the third light-emitting element; and thicknesses of color film layers of a same color in a same compensation group of the multiple compensation groups are the same.

The multiple compensation groups include at least a first compensation group and a second compensation group, and a brightness difference of light-emitting elements of a same light-emitting color in the first compensation group and the second compensation group under a same gray scale is larger than a preset value, and a thickness of a color film layer corresponding to the first compensation group is greater than a thickness of color film layers of a same color corresponding to the second compensation group.

In a third aspect, an embodiment of the present disclosure further provides a display device. The display device includes the display panel described in the above second aspect.

According to the embodiments of the present disclosure, the multiple compensation groups are formed on the substrate to obtain the array substrate, where the multiple compensation groups include at least the first compensation group and the second compensation group, and the brightness difference of the light-emitting elements of the same light-emitting color in the first compensation group and the second compensation group under the same gray scale is larger than the preset value; then the thicknesses of the first color film layer, the second color film layer and the third color film layer which correspond to each of the multiple compensation groups are calculated, respectively; and then the first color film layer is formed on the light-emitting side of the first light-emitting element, the second color film layer is formed on the light-emitting side of the second light-emitting element, and the third color film layer is formed on the light-emitting side of the third light-emitting element in the compensation group according to the thicknesses of the first color film layer, the second color film layer and the third color film layer obtained by calculation, the compensation group is used as a minimum compensation unit, the display difference compensation of the display panel is achieved by adopting the thickness adjustment of the color film layers, and thus the display uniformity of the display panel is improved.

BRIEF DESCRIPTION OF DRAWINGS

Embodiments of the present disclosure will become more apparent upon reading of the detailed description of non-limiting embodiments thereof with reference to following drawings.

FIG. 1 is a schematic flowchart of a preparation method of a display panel provided in an embodiment of the present disclosure;

FIG. 3 is a schematic flowchart of a method for calculating a thickness of a color filter layer provided in an embodiment of the present disclosure;

FIG. 4 is a schematic flowchart of a method for obtaining a test brightness and a target brightness provided in an embodiment of the present disclosure;

FIG. 5 is a schematic flowchart of a method for acquiring a sub-test brightness and a sub-target brightness provided in an embodiment of the present disclosure;

FIG. 7 is a schematic flowchart of still another preparation method of a display panel provided in an embodiment of the present disclosure;

DETAILED DESCRIPTION

Figure 2:
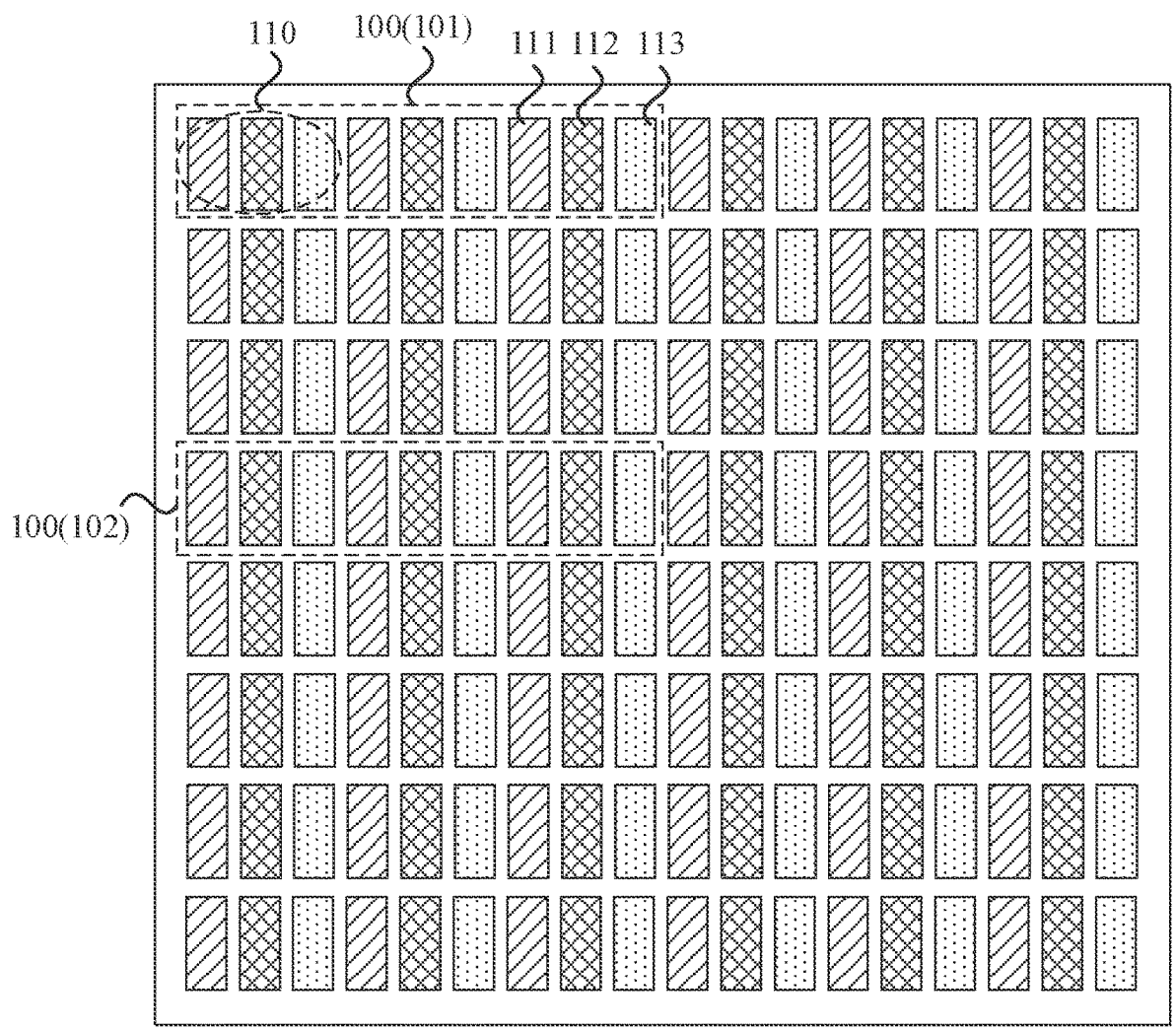
FIG. 2 is a top structural schematic diagram of an array substrate provided in an embodiment of the present disclosure.

In order to further explain the embodiments of the present disclosure, the embodiments, structures, features and effects of the display panel and the preparation method thereof, and the display device provided by the present disclosure will be described in detail below in conjunction with the accompanying drawings and embodiments, and the detailed description is as follows.

An embodiment of the present disclosure provides a preparation method of a display panel, the method includes described below.

S11: multiple compensation groups are formed on a substrate to obtain an array substrate; where each of the multiple compensation groups includes at least one pixel unit, each of the at least one pixel unit includes a first light-emitting element, a second light-emitting element and a third light-emitting element, and light-emitting colors are different among the first light-emitting element, the second light-emitting element and the third light-emitting element; the multiple compensation groups include at least a first compensation group and a second compensation group, and a brightness difference of light-emitting elements of a same light-emitting color in the first compensation group and the second compensation group under a same gray scale is larger than a preset value.

S12: thicknesses of a first color film layer, a second color film layer and a third color film layer which correspond to each of the multiple compensation groups are calculated, respectively, where the first color film layer is located on a light-emitting side of the first light-emitting element, the second color film layer is located on a light-emitting side of the second light-emitting element, and the third color film layer is located on a light-emitting side of the third light-emitting element.

S13: the first color film layer is formed on the light-emitting side of the first light-emitting element, the second color film layer is formed on the light-emitting side of the second light-emitting element, and the third color film layer is formed on the light-emitting side of the third light-emitting element according to the thicknesses of the first color film layer, the second color film layer and the third color film layer obtained in the S12.

According to the embodiments of the present disclosure, the multiple compensation groups are formed on the substrate to obtain the array substrate, where the multiple compensation groups include at least the first compensation group and the second compensation group, and the brightness difference of the light-emitting elements of the same light-emitting color in the first compensation group and the second compensation group under the same gray scale is larger than the preset value; then the thicknesses of the first color film layer, the second color film layer and the third color film layer which correspond to each of the multiple compensation groups are calculated, respectively; and then the first color film layer is formed on the light-emitting side of the first light-emitting element, the second color film layer is formed on the light-emitting side of the second light-emitting element, and the third color film layer is formed on the light-emitting side of the third light-emitting element in the compensation group according to the thicknesses of the first color film layer, the second color film layer and the third color film layer obtained by calculation, the compensation group is used as a minimum compensation unit, the light characteristic difference compensation of the light-emitting element is achieved by setting the thicknesses of the color film layers reasonably, and thus the display uniformity of the display panel is improved.

The embodiments of the present disclosure will be clearly and completely be described below in conjunction with the drawings in the embodiments of the present disclosure, and the described embodiments are merely a part of the embodiments of the present disclosure, and not all of the embodiments.

In the following description, numerous specific details are set forth in order to facilitate a thorough understanding of the present disclosure, but the present disclosure may also be embodied with other embodiments different from those described herein, a similar generalization may be made without departing from the connotation of the present disclosure, the present disclosure is therefore not to be limited by the specific embodiments disclosed below.

Then, the present disclosure is described in detail in conjunction with the schematic drawings, and in the detailed description of the embodiments of the present disclosure, the schematic diagrams showing the structure of the device are not enlarged partially according to the general scale for convenience of description, and the schematic diagrams are only examples, which should not limit the protection scope of the present disclosure. Moreover, three-dimensional spatial dimensions of length, width, and height should be included in the actual fabrication.

FIG. 1 is a schematic flowchart of a preparation method of a display panel provided in an embodiment of the present disclosure. The preparation method of the display panel is suitable for preparing such a display panel: a self-luminous element is used as a light source of a sub-pixel, a color film layer is arranged on a light-emitting side of any light-emitting element, and a color of the color film layer is the same as a light-emitting color of a light-emitting element corresponding to this color film layer. As shown in FIG. 1, the preparation method of the display panel may include following steps.

S11: multiple compensation groups are formed on a substrate to obtain an array substrate; where each of the multiple compensation groups includes at least one pixel unit, each of the at least one pixel unit includes a first light-emitting element, a second light-emitting element and a third light-emitting element, and light-emitting colors are different among the first light-emitting element, the second light-emitting element and the third light-emitting element; the multiple compensation groups include at least a first compensation group and a second compensation group, and a brightness difference of light-emitting elements of a same light-emitting color in the first compensation group and the second compensation group under a same gray scale is larger than a preset value.

Illustratively, FIG. 2 is a top structural schematic diagram of an array substrate provided in an embodiment of the present disclosure. As shown in FIG. 2, the array substrate includes multiple compensation groups 100, the multiple compensation groups 100 include three pixel units 110, and each of the three pixel units 110 includes a first light-emitting element 111, a second light-emitting element 112 and a third light-emitting element 113. A number of the multiple compensation groups 100 is greater than 2, the multiple compensation groups 100 include a first compensation group 101 and a second compensation group 102, and a brightness difference of light-emitting elements of a same light-emitting color in the first compensation group 101 and the second compensation group 102 under a same gray scale is larger than a preset value, and the preset value may be ljncd, for example; at this time, the non-uniformity of a brightness and a chromaticity of the array substrate is recognizable by human eyes, and compensation of the brightness and the chromaticity is needed to improve the uniformity of the brightness and the chromaticity.

It should be noted that FIG. 1 is illustrated by using an example, and not limitation, in which the compensation group 100 includes 3 pixel units 110, and in other embodiments of this embodiment, the compensation group 100 may further include other numbers of pixel units 110. It is worth noting that in this embodiment, brightness and chromaticity compensation parameters of light-emitting elements of a same color in a same compensation group 100 are the same, the compensation parameter is a thickness of the color film layer, and the more a number of the pixel units 110 in the compensation group 100, the finer the compensation of the brightness and the chromaticity. Therefore, for a display panel with poor display uniformity, the number of the pixel units in the compensation group 100 may be set to be small, and for a display panel with good display uniformity, the number of the pixel units in the compensation group 100 may be set to be slightly large, and a reasonable design is carried out according to actual display characteristics.

S12: thicknesses of a first color film layer, a second color film layer and a third color film layer which correspond to each of the multiple compensation groups are calculated, respectively, where the first color film layer is located on a light-emitting side of the first light-emitting element, the second color film layer is located on a light-emitting side of the second light-emitting element, and the third color film layer is located on a light-emitting side of the third light-emitting element.

Specifically, a color of the first color film layer is the same as a light-emitting color of the first light-emitting element, and a color of the second color film layer is the same as a light-emitting color of the second light-emitting element, and a color of the third color film layer is the same as a light-emitting color of the third light-emitting element. Illustratively, if the light-emitting color of the first light-emitting element is red, the light-emitting color of the second light-emitting element is green, and the light-emitting color of the third light-emitting element is blue, then the color of the first color film layer is red, the color of the second color film layer is green, and the color of the third color film layer is blue.

It should be noted that the color film layer has the brightness and chromaticity adjusting function and may adjust a brightness and a chromaticity of light emitted by the light-emitting element, and an adjusting degree is related to the thickness of the color film layer, and therefore it may be known that the thickness of the color film layer is reasonably set with a color film layer corresponding to the light-emitting elements of the same color in the compensation group being a minimum color film thickness adjusting unit, so that the brightness difference and the chromaticity difference between light emitted different compensation groups may be reduced. Specifically, the reasonable thickness of the color film layer may be calculated and obtained according to a preset manner, and a calculation manner is described in subsequent embodiments.

S13: the first color film layer is formed on the light-emitting side of the first light-emitting element, the second color film layer is formed on the light-emitting side of the second light-emitting element, and the third color film layer is formed on the light-emitting side of the third light-emitting element according to the thicknesses of the first color film layer, the second color film layer and the third color film layer obtained in the S12.

Specifically, a display device includes the array substrate and the color film layer located on the light-emitting side of the light-emitting element in the array substrate, and the color film layer includes the first color film layer, the second color film layer and the third color film layer. A preparation process of the display device includes: the array substrate is prepared, and then the color film layer is formed on the light-emitting side of the light-emitting element in the array substrate. It should be understood that the thicknesses of the first color film layer, the second color film layer and the third color film layer need to be determined before the color film layer is formed on the light-emitting side of the light-emitting element in the array substrate. In this embodiment, the S11 is a step of preparing the array substrate, the S12 is a step of determining the thicknesses of the first color film layer, the second color film layer and the third color film layer, and the S13 is a step of forming the color film layer on the light-emitting side of the light-emitting element in the array substrate.

In the embodiments of the present disclosure, the multiple compensation groups are formed on the substrate to obtain the array substrate, where the multiple compensation groups include at least the first compensation group and the second compensation group, and the brightness difference of the light-emitting elements of the same light-emitting color in the first compensation group and the second compensation group under the same gray scale is larger than the preset value; then the thicknesses of the first color film layer, the second color film layer and the third color film layer which correspond to each of the multiple compensation groups are calculated, respectively; and then the first color film layer is formed on the light-emitting side of the first light-emitting element, the second color film layer is formed on the light-emitting side of the second light-emitting element, and the third color film layer is formed on the light-emitting side of the third light-emitting element in the compensation group according to the thicknesses of the first color film layer, the second color film layer and the third color film layer obtained by calculation, the compensation group is used as a minimum compensation unit, the light characteristic difference compensation of the light-emitting element is achieved by setting the thicknesses of the color film layers reasonably, and thus the display uniformity of the display panel is improved.

According to this embodiment, the multiple compensation groups are formed on the substrate to obtain the array substrate, where the multiple compensation groups include at least the first compensation group and the second compensation group, and the brightness difference of the light-emitting elements of the same light-emitting color in the first compensation group and the second compensation group under the same gray scale is larger than the preset value; then the thicknesses of the first color film layer, the second color film layer and the third color film layer which correspond to each of the multiple compensation groups are calculated, respectively; and then the first color film layer is formed on the light-emitting side of the first light-emitting element, the second color film layer is formed on the light-emitting side of the second light-emitting element, and the third color film layer is formed on the light-emitting side of the third light-emitting element in the compensation group according to the thicknesses of the first color film layer, the second color film layer and the third color film layer obtained by calculation, the brightness difference and the chromaticity difference between the light-emitting elements of the same light-emitting color at different positions in the array substrate are eliminated by setting the thicknesses of the first color film layer, the second color film layer and the third color film layer reasonably, and thus the display uniformity of the display panel is improved.

FIG. 3 is a schematic flowchart of a method for calculating a thickness of a color filter layer provided in an embodiment of the present disclosure. As shown in FIG. 3, the step in which the thicknesses of the first color film layer located on the light-emitting side of the first light-emitting element, the second color film layer located on the light-emitting layer of the second light-emitting element, and the third color film layer located on the light-emitting side of the third light-emitting element in each of the multiple compensation groups are calculated respectively may include described below.

S21: a test brightness and a target brightness of the first light-emitting element, a test brightness and a target brightness of the second light-emitting element, and a test brightness and a target brightness of the third light-emitting element in each of the multiple compensation groups are acquired.

The test brightness is obtained based on a test, the target brightness is determined based on a preset brightness value, and a specific manner for obtaining the test brightness and the target brightness is described in subsequent embodiments.

S22: the thickness of the first color film layer is calculated and obtained according to a color film layer thickness calculation formula, the test brightness and the target brightness of the first light-emitting element in each of the multiple compensation groups, and a unit thickness transmittance of the first color film layer; the thickness of the second color film layer is calculated and obtained according to the color film layer thickness calculation formula, the test brightness and the target brightness of the second light-emitting element in each of the multiple compensation groups, and a unit thickness transmittance of the second color film layer; and the thickness of the third color film layer is calculated and obtained according to the color film layer thickness calculation formula, the test brightness and the target brightness of the third light-emitting element in each of the multiple compensation groups, and a unit thickness transmittance of the third color film layer.

It should be noted that the first color film layer, the second color film layer and the third color film layer adopt a same color film layer thickness calculation formula. It should be understood that the calculation formula of the thickness of the color film layer is related to the test brightness, the target brightness, and the thickness of the color film layer; after the test brightness and the target brightness of a light-emitting element of any light-emitting color in the compensation group are obtained, the test brightness and the target brightness are substituted into the calculation formula of the thickness of the color film layer, and a thickness of a color film layer of a same color may be calculated and obtained. It should be understood that a color film layer corresponding to the light-emitting elements of the same color in the compensation group serves as a minimum color film thickness adjusting unit, and color film layers corresponding to the light-emitting elements of the same light-emitting color in a same compensation group are the same in thickness, so that the calculation is performed by using the compensation group as the unit when the thickness of the color film layer is calculated.

In an embodiment, the color film layer thickness calculation formula is $H=L1/(L2 \times a)$, where H represents the thickness of the color film layer, L1 represents the target brightness of the light-emitting element, L2 represents the test brightness of the light-emitting element, and a represents the unit thickness transmittance of the color film layer.

Illustratively, the array substrate includes the multiple compensation groups, and any compensation group of the multiple compensation groups is a basic compensation group. If in the basic compensation group, the target brightness of the first light-emitting element is L11, the test brightness of the first light-emitting element is L21, and a1 is the unit thickness transmittance of the first color film layer, then the thickness of the first color film layer corresponding to the first light-emitting element in the basic compensation group is $H1=L11/(L21\times a1)$; if in the basic compensation group, the target brightness of the second light-emitting element is L12, the test brightness of the second light-emitting element is L22, and a2 is the unit thickness transmittance of the second color film layer, then the thickness of the second color film layer corresponding to the second light-emitting element in the basic compensation group is $H2=L12/(L22\times a2)$; and if in the basic compensation group, the target brightness of the third light-emitting element is L13, the test brightness of the third light-emitting element is L23, and a3 is the unit thickness transmittance of the third color film layer, then the thickness of the third color film layer corresponding to the third light-emitting element in the basic compensation group is $H3=L13/(L23\times a3)$.

The test brightness of the first light-emitting element in the basic compensation group is an overall test brightness of all first light-emitting elements in the basic compensation group, and the test brightness of the second light-emitting elements is an overall test brightness of all second light-emitting elements in the basic compensation group, and the test brightness of the third light-emitting elements is an overall test brightness of all third light-emitting elements in the basic compensation group; the compensation brightness of the first light-emitting element in the basic compensation group is an overall compensation brightness of all the first light-emitting elements in the basic compensation group, and the compensation brightness of the second light-emitting elements is an overall compensation brightness of all the second light-emitting elements in the basic compensation group, and the compensation brightness of the third light-emitting elements is an overall compensation brightness of all the third light-emitting elements in the basic compensation group.

FIG. 4 is a schematic flowchart of a method for obtaining a test brightness and a target brightness provided in an embodiment of the present disclosure. As shown in FIG. 4, the step in which the test brightness and the target brightness of the first light-emitting element, the test brightness and the target brightness of the second light-emitting element, and the test brightness and the target brightness of the third light-emitting element in each of the multiple compensation groups are acquired may include described below.

S31: a sub-test brightness and a sub-target brightness of the first light-emitting element, a sub-test brightness and a sub-target brightness of the second light-emitting element, and a sub-test brightness and a sub-target brightness of the third light-emitting element in each of the multiple compensation groups under a first pure color picture, a second pure color picture and a third pure color picture are acquired respectively.

A color of the first pure color picture is the same as the light-emitting color of the first light-emitting element, a color of the second pure color picture is the same as the light-emitting color of the second light-emitting element, and a color of the third pure color picture is the same as the light-emitting color of the third light-emitting element. Illustratively, if the light-emitting color of the first light-emitting element is red, the light-emitting color of the second light-emitting element is green, and the light-emitting color of the third light-emitting element is blue, then the first pure color picture is a red pure color picture, the second pure color picture is a green pure color picture, and the third pure color picture is a blue pure color picture.

It should be noted that the sub-test brightness is a brightness value obtained by the brightness test of all light-emitting elements of a same color in the same compensation group under a single pure color picture, the sub-target brightness is a target brightness that the all light-emitting elements of the same color in the same compensation group finally need to reach under the single pure color picture, and the sub-target brightness is obtained by calculation, and a calculation manner is described in subsequent embodiments.

S32: a sum of a sub-test brightness of the light-emitting elements of the same color under the first pure color picture, the second pure color picture and the third pure color picture is used as a test brightness of the light-emitting elements of the same color; and a sum of a sub-target brightness of the light-emitting elements of the same color under the first pure color picture, the second pure color picture and the third pure color picture is used as a target brightness of the light-emitting elements of the same color.

It should be noted that display manners of the first pure color picture, the second pure color picture and the third pure color picture are as follows: the first light-emitting element, the second light-emitting element and the third light-emitting element in all pixel units in the display panel are commonly lightened and cooperatively displayed. Illustratively, the first pure color picture is red, when the red picture is displayed, the first light-emitting element, the second light-emitting element and the third light-emitting element in the all pixel units in the display panel emit light, and three different colors of light are mixed to form red light.

It should also be noted that the color of the first pure color picture is a first color, the color of the second pure color picture is a second color, the color of the third pure color picture is a third color, and the light of the first color, the second color and the third color is mixed to form white light, and when the display panel is actually used for picture display, the white light is equivalent to the superposition display of the first pure color picture, the second pure color picture and the third pure color picture.

Therefore, a sum of a sub-test brightness of the first light-emitting element in the compensation group under the first pure color picture, the second pure color picture and the third pure color picture is used as the test brightness of the first light-emitting element; a sum of a sub-test brightness of the second light-emitting element under the first pure color picture, the second pure color picture and the third pure color picture is used as the test brightness of the second light-emitting element, and a sum of a sub-test brightness of the third light-emitting element under the first pure color picture, the second pure color picture and the third pure color picture is used as the test brightness of the third light-emitting element. A sum of a sub-target brightness of the first light-emitting element in the compensation group under the first pure color picture, the second pure color picture and the third pure color picture is used as the target brightness of the first light-emitting element; a sum of a sub-target brightness of the second light-emitting element under the first pure color picture, the second pure color picture and the third pure color picture is used as the target brightness of the second light-emitting element, and a sum of a sub-target brightness of the third light-emitting element under the first pure color picture, the second pure color picture and the third pure color picture is used as the target brightness of the third light-emitting element.

FIG. 5 is a schematic flowchart of a method for acquiring a sub-test brightness and a sub-target brightness provided in an embodiment of the present disclosure. As shown in FIG. 5, the step in which the sub-test brightness and the sub-target brightness of the first light-emitting element, the sub-test brightness and the sub-target brightness of the second light-emitting element, and the sub-test brightness and the sub-target brightness of the third light-emitting element in each of the multiple compensation groups under the first pure color picture, the second pure color picture and the third pure color picture are acquired respectively may include described below.

S111: the array substrate is controlled to display the first pure color picture; the sub-test brightness and a test color coordinate of the first light-emitting element, the sub-test brightness and a test color coordinate of the second light-emitting element, and the sub-test brightness and a test color coordinate of the third light-emitting element in each of the multiple compensation groups under the first pure color picture are tested and obtained; a target brightness and a target color coordinate of a pixel unit preset in the first pure color picture are acquired respectively; and the sub-target brightness of the first light-emitting element, the sub-target brightness of the second light-emitting element, and the sub-target brightness of the third light-emitting element in each of the multiple compensation groups under the first pure color picture are calculated and obtained according to a sub-target brightness calculation formula, the test color coordinate of the first light-emitting element, the test color coordinate of the second light-emitting element, and the test color coordinate of the third light-emitting element in each of the multiple compensation groups under the first pure color picture, and the target brightness and the target color coordinate of the pixel unit.

Specifically, the sub-test brightness and the test color coordinate are obtained through a direct test manner after the array substrate displays the first pure color picture, the test manner may be, for example, shooting the array substrate after the first pure color picture is displayed through an image collector, and analyzing the shot image to obtain the sub-test brightness and the test color coordinate of the first light-emitting element, the sub-test brightness and the test color coordinate of the second light-emitting element, and the sub-test brightness and the test color coordinate of the third light-emitting element in each compensation group in the array substrate.

It is worth noting that in a case where the compensation group includes multiple pixel units, the sub-test brightness and the test color coordinate of the first light-emitting element in the compensation group are an overall brightness and color coordinate of the first light-emitting element of all pixel units in this compensation group; the sub-test brightness and the test color coordinate of the second light-emitting element in the compensation group are an overall brightness and color coordinate of the second light-emitting element of all pixel units in this compensation group; and the sub-test brightness and the test color coordinate of the third light-emitting element in the compensation group are an overall brightness and color coordinate of the third light-emitting elements of all pixel units in this compensation group.

On the other hand, the sub-target brightness is obtained by calculation, and illustratively, in an embodiment, the sub-target brightness calculation formula may include:

$$LR=(RY*(L*BX*GY-L*GX*BY-L*BX*Y+L*X*BY+L*GX*Y-L*X*GY))/(BX*GY*Y-GX*BY*Y-BX*RY*Y+RX*BY*Y+GX*RY*Y-RX*GY*Y); \quad \text{Formula 1}$$

$$LG=-(GY*(L*BX*RY-L*RX*BY-L*BX*Y+L*X*BY+L*RX*Y-L*X*RY))/(BX*GY*Y-GX*BY*Y-BX*RY*Y+RX*BY*Y+GX*RY*Y-RX*GY*Y); \quad \text{Formula 2}$$

$$LB=(L*GX*BY*RY-L*RX*BY*GY-L*GX*BY*Y+L*X*BY*GY+L*RX*BY*Y-L*X*BY*RY)/(BX*GY*Y-GX*BY*Y-BX*RY*Y+RX*BY*Y+GX*RY*Y-RX*GY*Y); \quad \text{Formula 3}$$

LR represents the sub-target brightness of the first light-emitting element, LG represents the sub-target brightness of the second light-emitting element, LB represents the sub-target brightness of the third light-emitting element, RX and RY represent the test color coordinates of the first light-emitting element, GX and GY represent the test color coordinates of the second light-emitting element, BX and BY represent the test color coordinates of the third light-emitting element, L represents a target brightness of a pixel unit under a pure color picture, and X and Y represent the target color coordinates of the pixel unit under the pure color picture.

Illustratively, the array substrate includes the multiple compensation groups, any compensation group of the multiple compensation groups is selected as a target compensation group, and the target compensation group is taken as an example below. A calculation manner of the sub-target brightness of the first light-emitting element, the sub-target brightness of the second light-emitting element and the sub-target brightness of the third light-emitting element in the compensation group under the first pure color picture is described specifically. It should be understood that a calculation manner of the sub-target brightness of the first light-emitting element, the sub-target brightness of the second light-emitting element and the sub-target brightness of the third light-emitting element in other compensation groups in the array substrate under the first pure color picture is the same as a calculation manner of the sub-target brightness of the first light-emitting element, the sub-target brightness of the second light-emitting element and the sub-target brightness of the third light-emitting element in the target compensation group, which however are not to be detailed herein again.

Specifically, the calculation manner of the sub-target brightness of the first light-emitting element, the sub-target brightness of the second light-emitting element and the sub-target brightness of the third light-emitting element in the target compensation group under the first pure color picture is as follows.

In step 1, test color coordinates RX1 and RY1 of the first light-emitting element, test color coordinates GX1 and GY1 of the second light-emitting element and test color coordinates BX1 and BY1 of the third light-emitting element in the target compensation group under the first pure color picture obtained by testing are acquired.

In step 2, a target brightness L1 of the pixel unit under the first pure color picture and target color coordinates X1 and Y1 of the pixel unit under the first pure color picture are acquired. It should be noted that the target brightness and the target color coordinates of the pixel unit under the first pure color picture are preset known parameters.

In step 3, parameters obtained in the step 1 and the step 2 are brought into the formula 1, the sub-target brightness of the first light-emitting element under the first pure color picture is LR1=(RY1*(L1*BX1*GY1−L1*GX1*BY1−L1*BX1*Y1+L1*X1*BY1+L1*GX1*Y1−L1*X1*GY1))/(BX1*GY1*Y1−GX1*BY1*Y1−BX1*RY1*Y1+RX1*BY1*Y1+GX1*RY1*Y1−RX1*GY1*Y1), where parameters on the right side of the equal sign are all known parameters, and LR1 may be obtained by specific calculation.

In step 4, the parameters obtained in the step 1 and the step 2 are brought into the formula 2, and the sub-target brightness of the second light-emitting element under the first pure color picture is LG1=−(GY1*(L1*BX1*RY1−L1*RX1*BY1−L1*BX1*Y1+L1*X1*BY1+L1*RX1*Y1−L1*X1*RY1))/(BX1*GY1*Y1−GX1*BY1*Y1−

BX1*RY1*Y1+RX1*BY1*Y1+GX1*RY1*Y1−
RX1*GY1*Y1), where parameters on the right side of the equal sign are all known parameters, and LG1 may be obtained by specific calculation.

In step 5, the parameters obtained in the step 1 and the step 2 are brought into the formula 3, the sub-target brightness of the third light-emitting element under the first pure color picture is B1=(L1*GX1*BY1*RY1−L1*RX1*BY1*GY1−L1*GX1*BY1*Y1+L1*X1*BY1*GY1+L1*RX1*BY1*Y1−L1*X1*BY1*RY1)/(BX1*GY1*Y1−GX1*BY1*Y1−BX1*RY1*Y1+RX1*BY1*Y1+GX1*RY1*Y1−RX1*GY1*Y1), where parameters on the right side of the equal sign are all known parameters, and LB1 may be obtained by specific calculation.

S112: the sub-test brightness and the sub-target brightness of the first light-emitting element, the sub-test brightness and the sub-target brightness of the second light-emitting element, and the sub-test brightness and the sub-target brightness of the third light-emitting element in each of the multiple compensation groups under the second pure color picture are obtained according to the method of the S111; and the sub-test brightness and the sub-target brightness of the first light-emitting element, the sub-test brightness and the sub-target brightness of the second light-emitting element, and the sub-test brightness and the sub-target brightness of the third light-emitting element in each of the multiple compensation groups under the third pure color picture are obtained according to the method of the S111.

Illustratively, a calculation manner of the sub-target brightness of the first light-emitting element, the sub-target brightness of the second light-emitting element, and the sub-target brightness of the third light-emitting element in the target compensation group under the second pure color picture and the third pure color picture is used as an example for description.

Specifically, the calculation manner of the sub-target brightness of the first light-emitting element, the sub-target brightness of the second light-emitting element, and the sub-target brightness of the third light-emitting element in the target compensation group under the second pure color picture is as follows.

In step 1, test color coordinates RX2 and RY2 of the first light-emitting element, test color coordinates GX2 and GY2 of the second light-emitting element and test color coordinates BX2 and BY2 of the third light-emitting element in the target compensation group under the second pure color picture obtained by testing are acquired.

In step 2, a target brightness L2 of the pixel unit under the second pure color picture and target color coordinates X2 and Y2 of the pixel unit under the second pure color picture are acquired. It should be noted that the target brightness and the target color coordinates of the pixel unit under the second pure color picture are preset known parameters.

In step 3, parameters obtained in the step 1 and the step 2 are brought into the formula 1, the sub-target brightness of the first light-emitting element under the second pure color picture is LR2=(RY2*(L2*BX2*GY2−L2*GX2*BY2−L2*BX2*Y2+L2*X2*BY2+L2*GX2*Y2−L2*X2*GY2))/(BX2*GY2*Y2−GX2*BY2*Y2−BX2*RY2*Y2+RX2*BY2*Y2+GX2*RY2*Y2−RX2*GY2*Y2), where parameters on the right side of the equal sign are all known parameters, and LR2 may be obtained by specific calculation.

In step 4, the parameters obtained in the step 1 and the step 2 are brought into the formula 2, and the sub-target brightness of the second light-emitting element under the second pure color picture is LG2=−(GY2*(L2*BX2*RY2−L2*RX2*BY2−L2*BX2*Y2+L2*X2*BY2+L2*RX2*Y2−L2*X2*RY2))/(BX2*GY2*Y2−GX2*BY2*Y2−BX2*RY2*Y2+RX2*BY2*Y2+GX2*RY2*Y2−RX2*GY2*Y2), where parameters on the right side of the equal sign are all known parameters, and LG2 may be obtained by specific calculation.

In step 5, the parameters obtained in the step 1 and the step 2 are brought into the formula 3, the sub-target brightness of the third light-emitting element under the second pure color picture is LB2=(L2*GX2*BY2*RY2−L2*RX2*BY2*GY2−L2*GX2*BY2*Y2 +L2*X2*BY2*GY2+L2*RX2*BY2*Y2−L2*X2*BY2*RY2)/(BX2*GY2*Y2−GX2*BY2*Y2−BX2*RY2*Y2+RX2*BY2*Y2+GX2*RY2*Y2−RX2*GY2*Y2), where parameters on the right side of the equal sign are all known parameters, and LB2 may be obtained by specific calculation.

Moreover, the calculation manner of the sub-target brightness of the first light-emitting element, the sub-target brightness of the second light-emitting element, and the sub-target brightness of the third light-emitting element in the target compensation group under the third pure color picture is as follows.

In step 1, test color coordinates RX3 and RY3 of the first light-emitting element, test color coordinates GX3 and GY3 of the second light-emitting element and test color coordinates BX3 and BY3 of the third light-emitting element in the target compensation group under the third pure color picture obtained by testing are acquired.

In step 2, a target brightness L3 of the pixel unit under the third pure color picture and target color coordinates X3 and Y3 of the pixel unit under the third pure color picture are acquired. It should be noted that the target brightness and the target color coordinates of the pixel unit under the third pure color picture are preset known parameters.

In step 3, parameters obtained in the step 1 and the step 2 are brought into the formula 1, the sub-target brightness of the first light-emitting element under the third pure color picture is LR3=(RY3*(L3*BX3*GY3−L3*GX3*BY3−L3*BX3*Y3+L3*X3*BY3+L3*GX3*Y3 L3*X3*GY3))/(BX3*GY3*Y3−GX3*BY3*Y3−BX3*RY3*Y3+RX3*BY3*Y3+GX3*RY3*Y3−RX3*GY3*Y3), where parameters on the right side of the equation are all known parameters, and LR3 may be obtained by specific calculation.

In step 4, the parameters obtained in the step 1 and the step 2 are brought into the formula 2, and the sub-target brightness of the second light-emitting element under the third pure color picture is LG3=−(GY3*(L3*BX3*RY3−L3*RX3*BY3−L3*BX3*Y3+L3*X3*BY3+L3*RX3*Y3−L3*X3*RY3))/(BX3*GY3*Y3−BX3*RY3*Y3+RX3*BY3*Y3+GX3*RY3*Y3−RX3*GY3*Y3), where parameters on the right side of the equal sign are all known parameters, and LG3 may be obtained by specific calculation.

In step 5, the parameters obtained in the step 1 and the step 2 are brought into the formula 3, the sub-target brightness of the third light-emitting element under the third pure color picture is LB3=(L3*GX3*BY3*RY3−L3*RX3*BY3*GY3−L3*GX3*BY3*Y3+L3*X3*BY3*GY3+L3*RX3*BY3*Y3−L3*X3*BY3*RY3)/(BX3*GY3*Y3−GX3*BY3*Y3−BX3*RY3*Y3+RX3*BY3*Y3+GX3*RY3*Y3−RX3*GY3*Y3), where parameters on the right side of the equal sign are all known parameters, and LB3 may be obtained by specific calculation.

Figure 6:
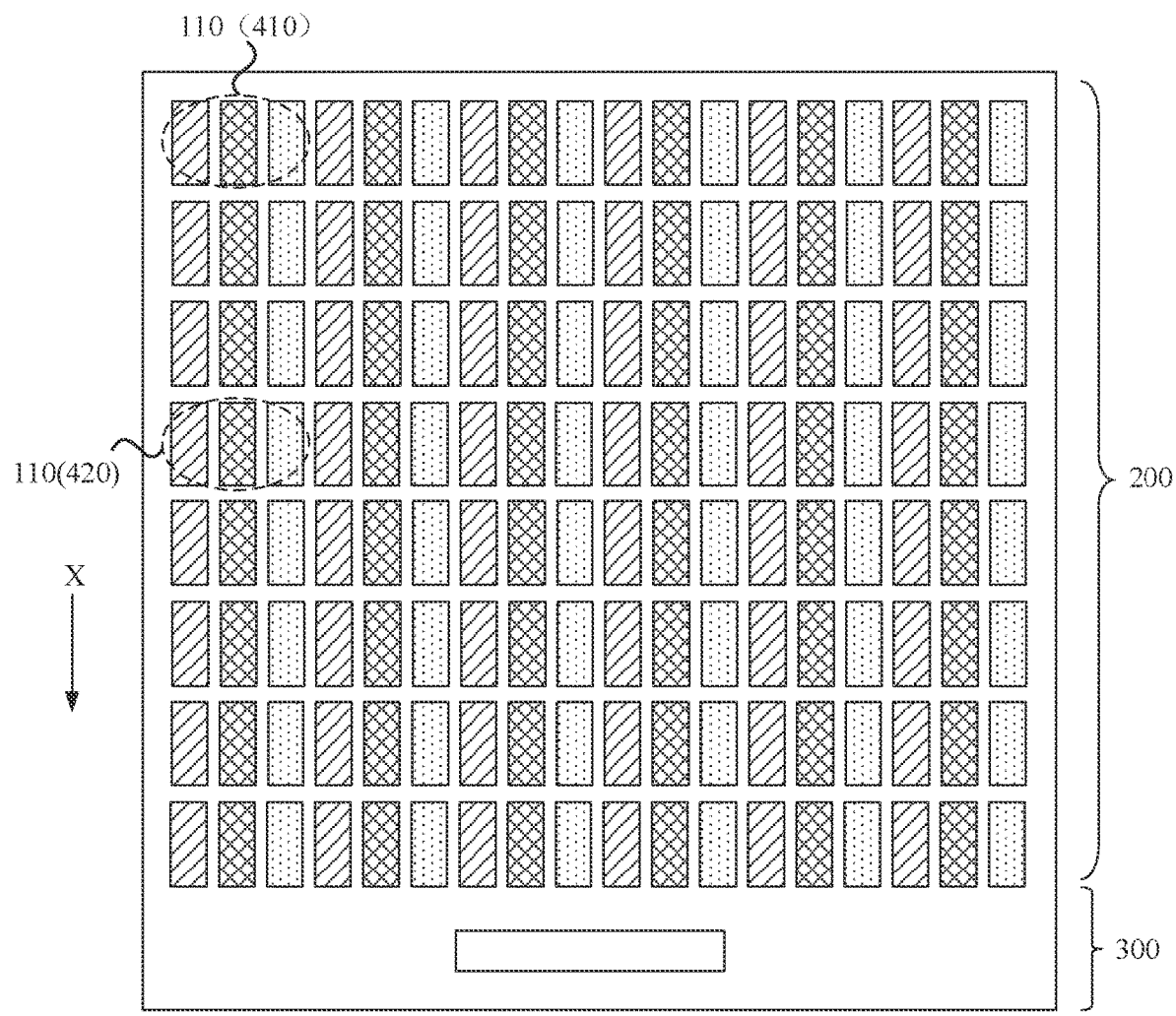
FIG. 6 is a schematic structural diagram of a display panel provided in an embodiment of the present disclosure.

In an embodiment, FIG. 6 is a schematic structural diagram of a display panel provided in an embodiment of the present disclosure. As shown in FIG. 6, the display panel includes a display area 200 and a binding area 300 which are sequentially arranged in a first direction X, the pixel unit 400 is located in the display area 200 and includes a first pixel unit 410 and a second pixel unit 420, and the second pixel unit 420 is located between the first pixel unit 410 and the binding area 300. FIG. 7 is a schematic flowchart of still another preparation method of a display panel provided in an embodiment of the present disclosure. Corresponding to the display panel shown in FIG. 6, as shown in FIG. 7, on the basis of FIG. 3, after the S12, the method may further include described below.

S23: a thickness ratio among the first color film layer, the second color film layer and the third color film layer corresponding to the first pixel unit is kept unchanged; a thickness ratio among the first color film layer, the second color film layer and the third color film layer corresponding to the second pixel unit is kept unchanged; and the thicknesses of the first color film layer, the second color film layer and the third color film layer are adjusted, where thickness adjustment amounts of the first color film layer, the second color film layer and the third color film layer in the first pixel unit are respectively less than thickness adjustment amounts of color film layers of a same color in the second pixel unit.

It should be noted that the binding area is used for binding a driver chip or binding a flexible printed circuit board electrically connected to the driver chip, and due to the influence of a voltage drop, the voltage drop of the pixel unit farther away from the binding area is larger, the brightness is smaller, which is one of reasons for causing poor brightness uniformity of the display panel. In consideration of the problem of the voltage drop, after the thicknesses of the first color film layer, the second color film layer and the third color film layer are calculated and obtained in the S21, the thicknesses of the first color film layer, the second color film layer and the third color film layer are further adjusted to weaken or even eliminate the influence of the voltage drop on the brightness uniformity of the display panel.

Specifically, the color film has a filtering effect, the light-emitting brightness of sub-pixels in the first pixel unit and the second pixel unit may be adjusted by adjusting thicknesses of color film layers corresponding to the first pixel unit and the second pixel unit, and since the first pixel unit is farther away from the binding area relative to the second pixel unit, so that the voltage drop is larger. Therefore, the thickness adjustment amounts of the first color film layer, the second color film layer and the third color film layer in the first pixel unit is set to be respectively less than the thickness adjustment amounts of the color film layers of the same color in the second pixel unit, so that the brightness difference caused by voltage drop may be compensated by the thickness change of the color film layers, and the brightness uniformity is further improved; the specific adjustment manner may be, for example, reducing a thickness of a color film layer corresponding to the first pixel unit or increasing a thickness of a color film layer corresponding to the second pixel unit.

It is worth noting that in order to avoid the influence of a thickness adjustment operation of the color film layer for a voltage drop on the brightness and chromaticity adjustment effect of the color film layer calculated and obtained in the S21, the thicknesses of the first color film layer, the second color film layer and the third color film layer are further adjusted on the premise of keeping a thickness proportion of the first color film layer, the second color film layer and the third color film layer calculated and obtained in the S21 unchanged.

Figure 8:
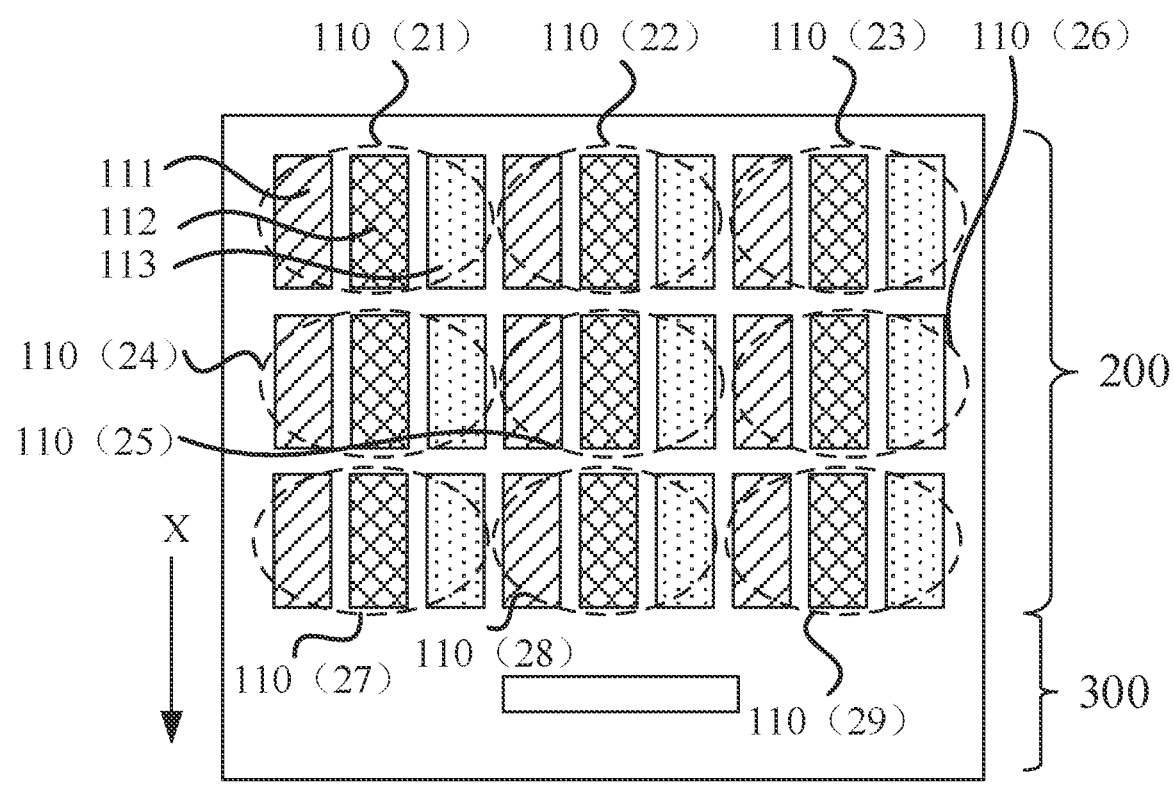
FIG. 8 is a schematic structural diagram of a display panel provided in an embodiment of the present disclosure.

In an embodiment, FIG. 8 is a schematic structural diagram of a display panel provided in an embodiment of the present disclosure. As shown in FIG. 8, all pixel units 110 in the display panel are arranged in a matrix in the display area 200, a column direction of the matrix is the same as the first direction X, light-emitting elements of a same color in the pixel units 110 in a same row belong to a same wafer, and a thickness ratio of the first color film layer and the second color film layer is the same as a thickness ratio of the second color film layer and the third color film layer in the pixel units 110 in a same row.

Illustratively, with continued reference to FIG. 8, the array substrate, for example, includes 9 pixel units 21, 22, 23, 24, 25, 26, 27, 28, 29 arranged in 3 rows and 3 columns. The first light-emitting elements 111 in the pixel units 21, 22 and 23 belong to the same wafer, the second light-emitting elements 112 in the pixel units 21, 22 and 23 belong to the same wafer, and the third light-emitting elements 113 in the pixel units 21, 22 and 23 belong to the same wafer; the first light-emitting elements 111 in the pixel units 24, 25 and 26 belong to the same wafer, the second light-emitting elements 112 in the pixel units 24, 25 and 26 belong to the same wafer, and the third light-emitting elements 113 in the pixel units 24, 25 and 26 belong to the same wafer; the first light-emitting elements 111 in the pixel units 27, 28 and 29 belong to the same wafer, the second light-emitting elements 112 in the pixel units 27, 28 and 29 belong to the same wafer, and the third light-emitting elements 113 in the pixel units 27, 28 and 29 belong to the same wafer. The thickness ratio of the first color film layer and the second color film layer is the same as the thickness ratio of the second color film layer and the third color film layer in the pixel units 21, 22 and 23, the thickness ratio of the first color film layer and the second color film layer is the same as the thickness ratio of the second color film layer and the third color film layer in the pixel units 24, 25 and 26, and the thickness ratio of the first color film layer and the second color film layer is the same as the thickness ratio of the second color film layer and the third color film layer in the pixel units 27, 28 and 29.

Figure 9:
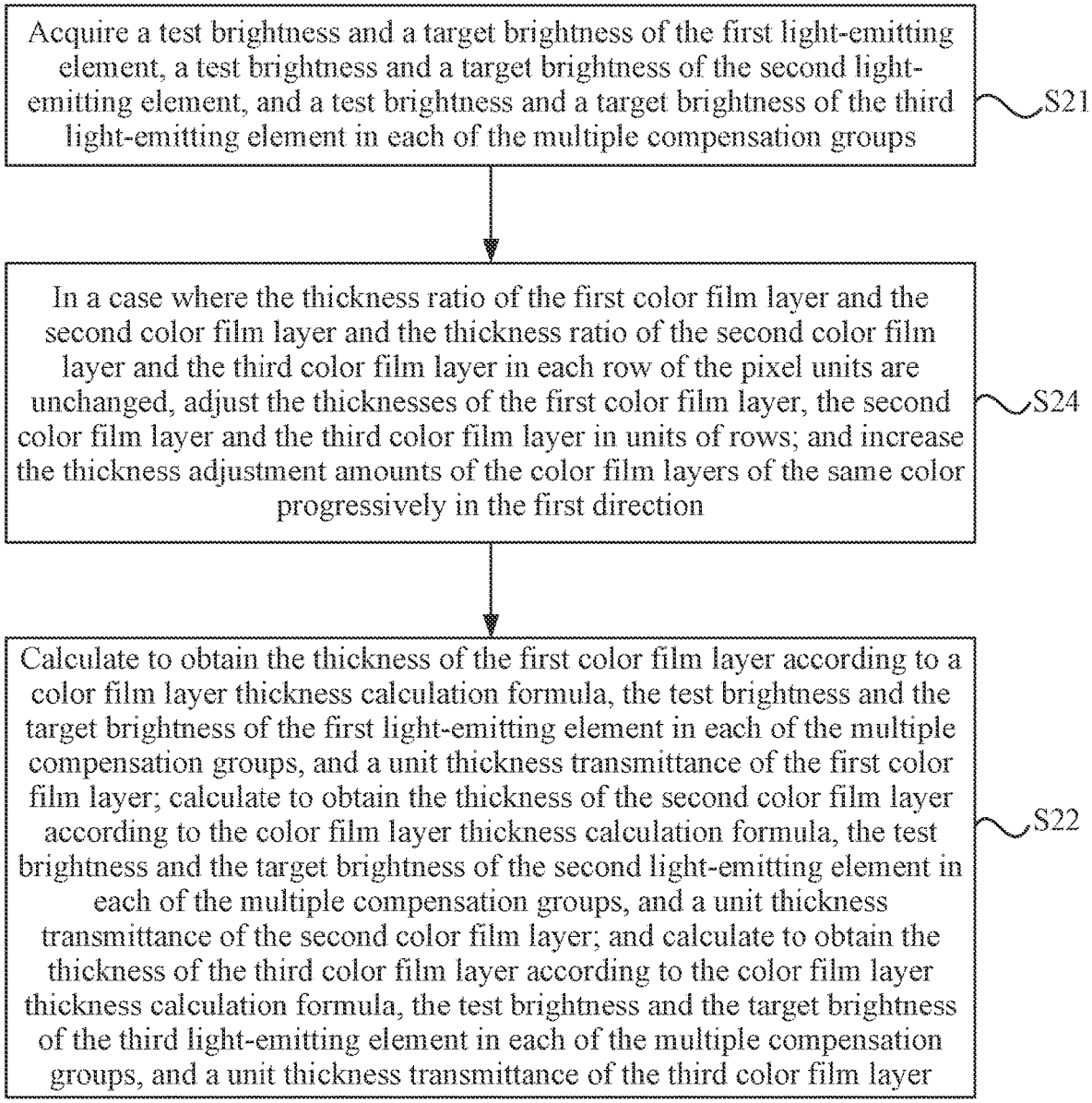
FIG. 9 is a schematic flowchart of still another preparation method of a display panel provided in an embodiment of the present disclosure.

Correspondingly, FIG. 9 is a schematic flowchart of still another preparation method of a display panel provided in an embodiment of the present disclosure. As shown in FIG. 9, after the S12, the method may further include described below.

S24: the thickness ratio of the first color film layer and the second color film layer and the thickness ratio of the second color film layer and the third color film layer in each row of the pixel units are kept unchanged; the thicknesses of the first color film layer, the second color film layer and the third color film layer are adjusted in units of rows; and the thickness adjustment amounts of the color film layers of the same color are increased progressively in the first direction.

Illustratively, as shown in FIG. 8, in the pixel units 21, 22 and 23 calculated and obtained in the S21, the thickness ratio of the first color film layer and the second color film layer is a:b, and the thickness ratio of the second color film layer and the third color film layer is b:c; in the pixel units 24, 25 and 26 calculated and obtained in the S21, the thickness ratio of the first color film layer and the second color film layer is d:e, and the thickness ratio of the second color film layer and the third color film layer is e:f; in the pixel units 27, 28 and 29 calculated and obtained in the S21, the thickness ratio of the first color film layer and the second color film layer is g:h, and the thickness ratio of the second color film layer and the third color film layer is h:i; on this basis, the thickness ratios described above are kept unchanged, and the thicknesses of the first color film layer, the second color film layer and the third color film layer located in the pixel units 21, 22 and 23 in the first row are adjusted, and the thicknesses of the first color film layer, the second color film layer and the third color film layer located in the pixel units 24, 25 and 26 in the second row are adjusted; the thicknesses of the first color film layer, the second color film layer and the third color film layer located in the pixel units 27, 28 and 29 in the third row; and the thicknesses adjustment amounts of the first color film layer, the second color film layer and the third color film layer located in the pixel units 21, 22 and 23 in the first row are for example a1, b1 and c1, respectively; the thickness adjustment amounts of the first color film layer, the second color film layer and the third color film layer located in the pixel units 24, 25 and 26 in the second row are d1, e1 and f1 are for example d1, e1 and f1, respectively, the thicknesses of the first color film layer, the second color film layer and the third color film layer located in the pixel units 27, 28 and 29 in the third row are for example g1, h1 and i1, respectively, where a1<d1<g1, b1<e1<h1, and c1<f1<i1.

At this time, the pixel units in a same row belong to the same compensation group, and the thickness adjustment amounts of the color film layers corresponding to the light-emitting elements belonging to the same wafer are the same, so that it should be understood that the light-emitting elements belonging to the same wafer have the same preparation process parameters, the same device performance and almost the same light-emitting brightness and chromaticity; and meanwhile, the thickness of a corresponding color film layer is adjusted, so that the calculation and design difficulty is simplified on the basis that the display panel has good uniformity after adjustment.

Figure 10:
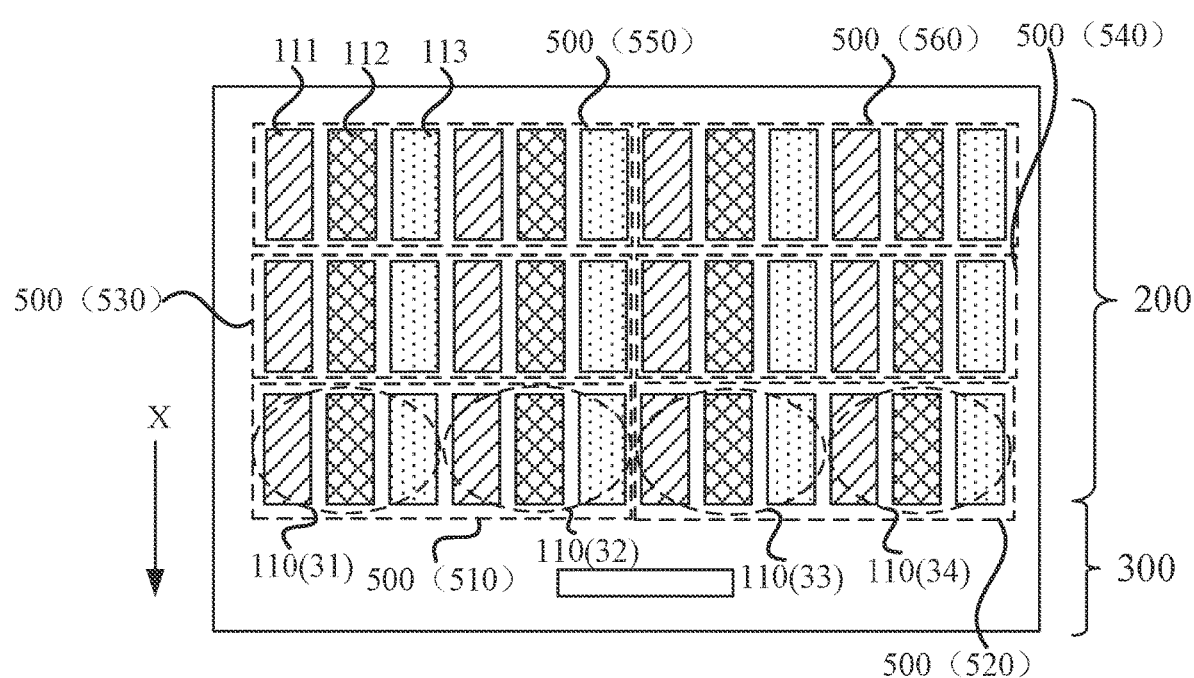
FIG. 10 is a schematic flowchart of still another preparation method of a display panel provided in an embodiment of the present disclosure.

In other embodiments of this embodiment, FIG. 10 is a schematic flowchart of still another preparation method of a display panel provided in an embodiment of the present disclosure. As shown in FIG. 10, all pixel units 110 are arranged in a matrix in the display area 200, a column direction of the matrix is the same as the first direction X, each row of pixel units 110 includes at least two sequentially arranged sub-pixel unit rows 500, and each sub-pixel unit row 500 includes multiple pixel units 110; in a same sub-pixel unit row 500, light-emitting elements of a same color of the pixel units 110 belong to a same wafer, and a thickness ratio of the first color film layer and the second color film layer is the same as a thickness ratio of the second color film layer and the third color film layer corresponding to each of the multiple pixel units 110; in different sub-pixel unit rows 500, the light-emitting elements of the same color of the pixel units 110 belong to different wafers, and a thickness ratio of the first color film layer and the second color film layer is different from a thickness ratio of the second color film layer and the third color film layer corresponding to each of the multiple pixel units 110.

Illustratively, with continued reference to FIG. 10, the array substrate includes 12 pixel units 110 arranged in 3 rows and 4 columns, a third row of pixel units near the binding area 300 is used as an example, the third row of pixel units includes 2 sub-pixel unit rows 510 and 520, the first light-emitting elements 111 in the 2 pixel units 31 and 32 in the sub-pixel unit row 510 belong to the same wafer, the second light-emitting elements 112 in the 2 pixel units 31 and 32 in the sub-pixel unit row 510 belong to the same wafer, and the third light-emitting elements 113 in the 2 pixel units 31 and 32 in the sub-pixel unit row 510 belong to the same wafer. The first light-emitting elements 111 in the 2 pixel units 33, 34 in the sub-pixel unit row 520 belong to the same wafer, the second light-emitting elements 112 in the 2 pixel units 33, 34 in the sub-pixel unit row 520 belong to the same wafer, and the third light-emitting elements 113 in the 2 pixel units 33, 34 in the sub-pixel unit row 520 belong to the same wafer. The first light-emitting elements 111 in the 2 pixel units 31, 32 in the sub-pixel unit row 510 and the first light-emitting elements 111 in the 2 pixel units 33, 34 in the sub-pixel unit row 520 belong to different wafers respectively, the second light-emitting elements 112 in the 2 pixel units 31, 32 in the sub-pixel unit row 510 and the second light-emitting elements 112 in the 2 pixel units 33, 34 in the sub-pixel unit row 520 belong to different wafers respectively, and the third light-emitting elements 113 in the 2 pixel units 31, 32 in the sub-pixel unit row 510 and the third light-emitting elements 113 in the 2 pixel units 33, 34 in the sub-pixel unit row 520 belong to different wafers respectively.

Figure 11:
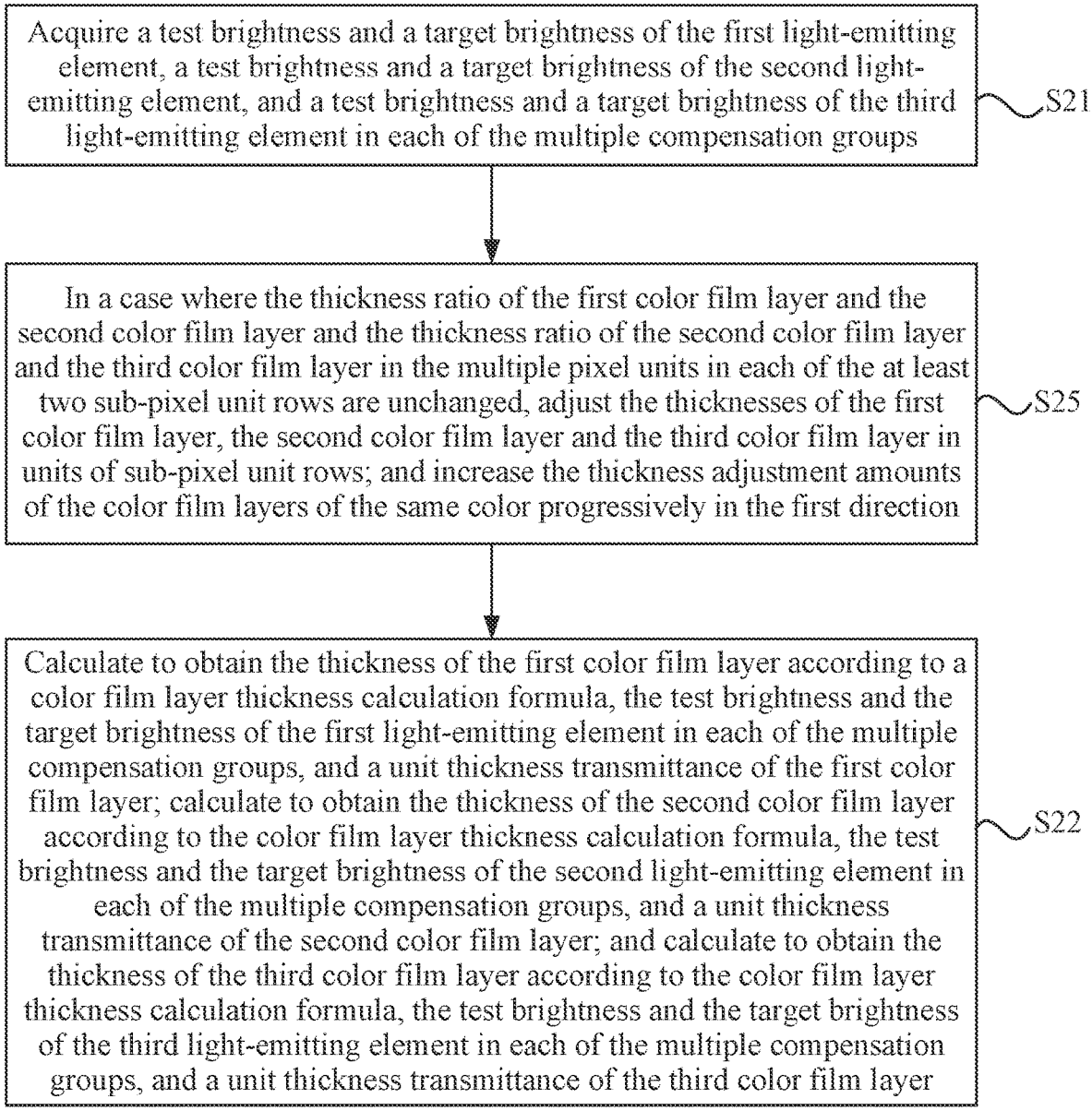
FIG. 11 is a schematic flowchart of still another preparation method of a display panel provided in an embodiment of the present disclosure.

Correspondingly, FIG. 11 is a schematic flowchart of still another preparation method of a display panel provided in an embodiment of the present disclosure. As shown in FIG. 11, after the S12, the method may further include described below.

S25: the thickness ratio of the first color film layer and the second color film layer and the thickness ratio of the second color film layer and the third color film layer in the multiple pixel units in each of the at least two sub-pixel unit rows are kept unchanged; the thicknesses of the first color film layer, the second color film layer and the third color film layer are adjusted in units of sub-pixel unit rows; and the thickness adjustment amounts of the color film layers of the same color are increased progressively in the first direction.

Illustratively, with continued reference to FIG. 10, the display panel includes 6 sub-pixel unit rows 510, 520, 530, 540, 550, 560, and in the sub-pixel unit rows 510, 520, 530, 540, 550, 560 calculated and obtained in the S21, the thickness ratio of the first color film layer and the second color film layer is a1:b1, a2:b2, a3:b3, a4:b4, a5:b5, a6:b6, and the thickness ratio of the second color film layer and the third color film layer is b1:c1, b2:c2, b3:c3, b4:c4, b5:c5, b6:c6; on this basis, the thickness ratios described above are kept unchanged, the thicknesses of the first color film layer, the second color film layer and the third color film layer are adjusted in units of sub-pixel unit rows, and the thickness adjustment amounts of the first color film layer, the second color film layer and the third color film layer in the sub-pixel unit rows 510 are e1, f1 and g1, respectively; the thickness adjustment amounts of the first color film layer, the second color film layer and the third color film layer in the sub-pixel unit row 520 are e2, f2 and g2, respectively, and the thickness adjustment amounts of the first color film layer, the second color film layer and the third color film layer in the sub-pixel unit row 530 are e3, f3 and g3, respectively. The thickness adjustment amounts of the first color film layer, the second color film layer and the third color film layer in the sub-pixel unit row 540 are e4, f4 and g4, respectively, and the thickness adjustment amounts of the first color film layer, the second color film layer and the third color film layer in the sub-pixel unit row 550 are e5, f5 and g5 respectively, and the thickness adjustment amounts of the first color film layer, the second color film layer, and the third color film layer in the sub-pixel unit row 560 are e6, f6, and g6, respectively, for example, where e1>e3>e5, e2>e4>e6, f1>f3>f5, f2>f4>f6, g1>g3>g5, and g2>g4>g6.

Thus, light-emitting elements of a same color on different wafers may be transferred to a same pixel unit row, which increases a length of the pixel unit row and is suitable for a large-size and high-pixel-density display panel.

In an embodiment, a thickness adjustment amount difference of the color film layers of the same color increases progressively in the first direction, and the thickness adjustment amount difference is a difference between a thickness adjustment amount of a color film layer close to a side of the binding area and a thickness adjustment amount of a color film layer away from a side of the binding area in adjacent color film layers of the same color.

Illustratively, with continued reference to FIG. 10, $e1-e3>e3-e5$, $e2-e4>e4-e6$, $f1-f3>f3-f5$, $f2-f4>f4-f6$, $g1-g3>g3-g5$, $g2-g4>g4-g6$.

Figure 12:
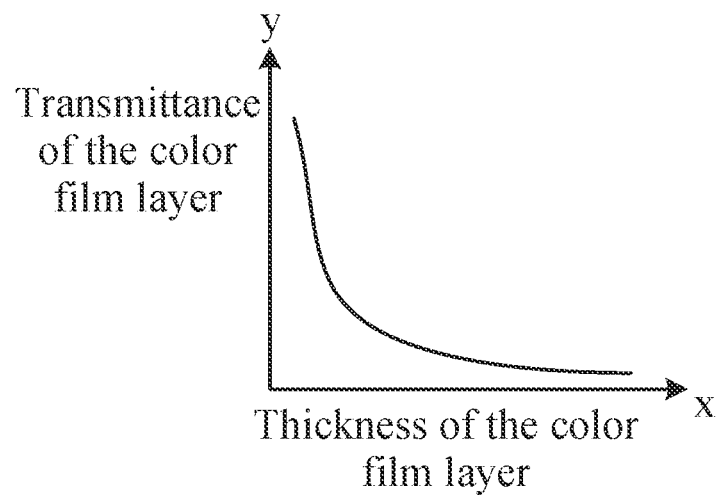
FIG. 12 is a graph illustrating a variation of a transmittance of a color film layer with a thickness of the color film layer provided in an embodiment of the present disclosure.

It should be noted that when the thickness of the color film layer is adjusted according to the voltage drop, the thickness of the color film layer closer to the binding area is thicker, on the other hand, the brightness change caused by the voltage drop is close to linear change, and when the brightness difference is reduced by increasing the thickness of the color film layer, if the thickness and the transmittance of the color film layer are also linear, then the difference in thickness adjustment of adjacent color film layers is fixed. As shown in the FIG. 12, along with the increase of the thickness of the color film layer, the change amount of the transmittance of the color film layer is reduced, and when the same brightness change is compensated, the adjustment amount of the thick color film layer close to the binding area needs to be relatively large, so that effective compensation may be achieved, and thus in this embodiment, a thickness adjustment amount difference of the color film layers of the same color increases progressively in the first direction, so that the brightness unevenness caused by the voltage drop is compensated more effectively, and the brightness uniformity of the display panel is improved.

Figure 13:
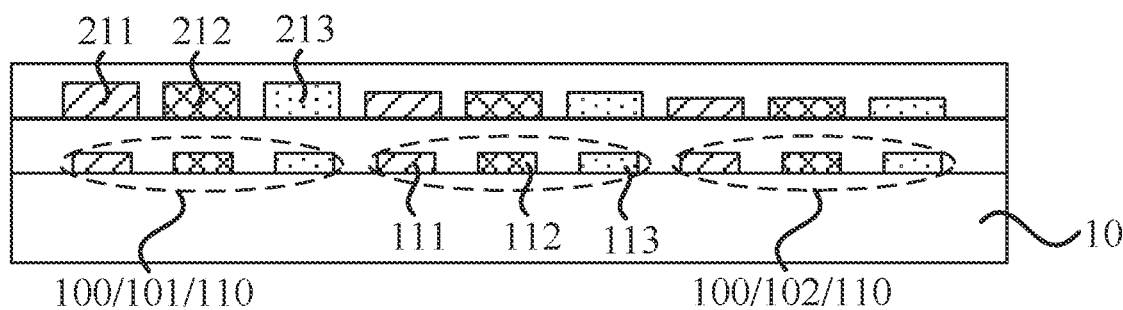
FIG. 13 is a schematic structural diagram of a display panel provided in an embodiment of the present disclosure.

FIG. 13 is a schematic structural diagram of a display panel provided in an embodiment of the present disclosure. The display panel is prepared by adopting the preparation method of the display panel provided by any embodiment of the present disclosure. As shown in FIG. 13, the display panel includes a substrate 10 and multiple compensation groups 100 located on the substrate 10, each of the multiple compensation groups 100 includes at least one pixel unit 110, each of the at least one pixel unit 110 includes a first light-emitting element 111, a second light-emitting element 112, and a third light-emitting element 113, and light-emitting colors are different among the first light-emitting element 111, the second light-emitting element 112 and the third light-emitting element 113. A first color film layer 211 is arranged on a light-emitting side of the first light-emitting element 111, a color of the first color film layer 211 is the same as a light-emitting color of the first light-emitting element 111; a second color film layer 212 is arranged on a light-emitting side of the second light-emitting element 112, and a color of the second color film layer 212 is the same as a light-emitting color of the second light-emitting element 112; a third color film layer 213 is arranged on a light-emitting side of the third light-emitting element 113, and a color of the third color film layer 213 is the same as a light-emitting color of the third light-emitting element 113; and thicknesses of color film layers of a same color in a same compensation group of the multiple compensation groups 100 are the same.

The multiple compensation groups 100 include at least a first compensation group 101 and a second compensation group 102, and a brightness difference of light-emitting elements of a same light-emitting color in the first compensation group 101 and the second compensation group 102 under a same gray scale is larger than a preset value, and a thickness of a color film layer corresponding to the first compensation group 101 is greater than a thickness of color film layers of a same color corresponding to the second compensation group 102.

A value range of the preset value is greater than 1 jncd, which indicates that the light-emitting element has non-uniformity which may be identified by human eyes, and the brightness and the chromaticity need to be adjusted through the thickness of the color film.

In this embodiment, the first light-emitting element 111, the second light-emitting element 112 and the third light-emitting element 113 are all micro-LEDs.

In an embodiment, with continued reference to FIG. 13, the compensation group 100 includes one pixel unit 110.

In other embodiments of this embodiment, a number of the at least one pixel unit 110 in the compensation group 100 may be greater than or equal to 2, light-emitting elements in the same compensation group of the multiple compensation groups 100 belong to a same wafer, and light-emitting elements in different compensation groups of the multiple compensation groups belong to different wafers.

Compared with different wafers, electrical features of the light-emitting elements on the same wafer are more similar, and in order to ensure that the uniformity of each pixel unit in the same compensation group 100 is better after the thickness of the color film layer is adjusted by taking the color film layer of the same color in the compensation group 100 as a minimum unit, the light-emitting elements in the same compensation group 100 are set to belong to the same wafer, so that the light-emitting elements in different compensation groups 100 belong to different wafers.

In an embodiment, light-emitting colors of the first light-emitting element 111, the second light-emitting element 112, and the third light-emitting element 113 are any one of red, green, and blue, respectively, and colors are different from each other.

It should be noted that red, green, and blue are three primary colors of light, and red, green, and blue of different intensities may be mixed to obtain light of various colors, so that the light-emitting colors of the first light-emitting element 111, the second light-emitting element 112, and the third light-emitting element 113 are respectively any one of red, green, and blue, and the colors are different from each other. The display panel is diversified in display color, and the display color of the display panel is enriched.

Figure 14:
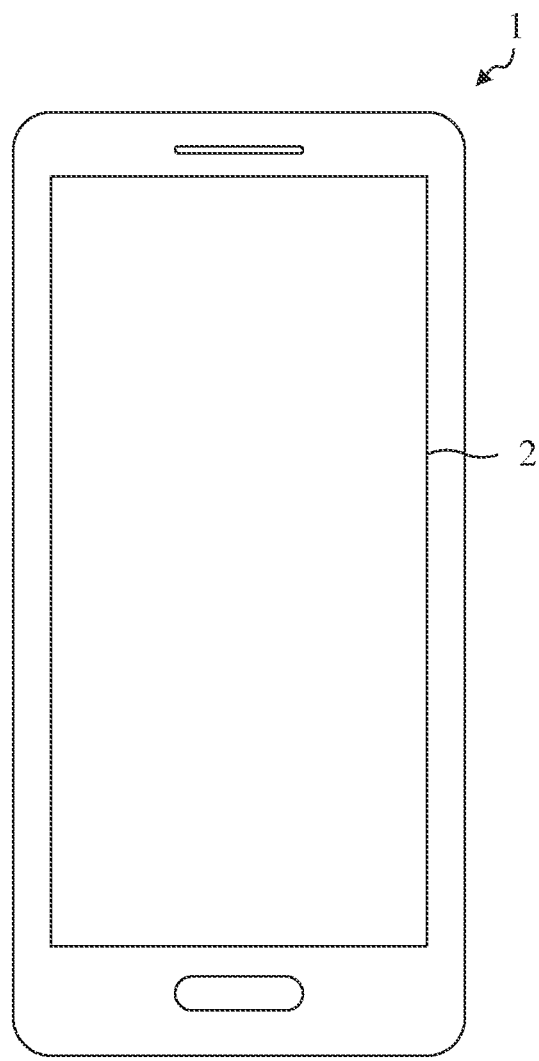
FIG. 14 is a schematic structural diagram of a display device provided in an embodiment of the present disclosure.

FIG. 14 is a schematic structural diagram of a display device provided in an embodiment of the present disclosure. As shown in FIG. 14, the display device 1 includes the display panel 2 provided in any embodiment of the present disclosure. The display device 1 provided by this embodiment includes any display panel 2 provided by the embodiments of the present disclosure, and has the same or corresponding beneficial effects as the display panel 2 included in the display device 1, which however are not to be detailed herein again.

What is claimed is:

1. A preparation method of a display panel, comprising:
   S11: forming a plurality of compensation groups on a substrate to obtain an array substrate; wherein each of the plurality of compensation groups comprises at least one pixel unit, each of the at least one pixel unit comprises a first light-emitting element, a second light-emitting element and a third light-emitting element, and light-emitting colors are different among the first light-emitting element, the second light-emitting element and the third light-emitting element; the plurality of compensation groups comprise at least a first compensation group and a second compensation group, and a brightness difference of light-emitting elements of a same light-emitting color in the first compensation group and the second compensation group under a same gray scale is larger than a preset value;

S12: calculating thicknesses of a first color film layer, a second color film layer and a third color film layer which correspond to each of the plurality of compensation groups, respectively, wherein the first color film layer is located on a light-emitting side of the first light-emitting element, the second color film layer is located on a light-emitting side of the second light-emitting element, and the third color film layer is located on a light-emitting side of the third light-emitting element; and S13: forming the first color film layer on the light-emitting side of the first light-emitting element, forming the second color film layer on the light-emitting side of the second light-emitting element, and forming the third color film layer on the light-emitting side of the third light-emitting element according to the thicknesses of the first color film layer, the second color film layer and the third color film layer obtained in the S12, wherein calculating, in each of the plurality of compensation groups, the thicknesses of the first color film layer located on the light-emitting side of the first light-emitting element, the second color film layer located on the light-emitting layer of the second light-emitting element, and the third color film layer located on the light-emitting side of the third light-emitting element, respectively, comprises:

acquiring, in each of the plurality of compensation groups, a test brightness and a target brightness of the first light-emitting element, a test brightness and a target brightness of the second light-emitting element, and a test brightness and a target brightness of the third light-emitting element;

calculating to obtain the thickness of the first color film layer according to a color film layer thickness calculation formula, the test brightness and the target brightness of the first light-emitting element in each of the plurality of compensation groups, and a unit thickness transmittance of the first color film layer; calculating to obtain the thickness of the second color film layer according to the color film layer thickness calculation formula, the test brightness and the target brightness of the second light-emitting element in each of the plurality of compensation groups, and a unit thickness transmittance of the second color film layer; and calculating to obtain the thickness of the third color film layer according to the color film layer thickness calculation formula, the test brightness and the target brightness of the third light-emitting element in each of the plurality of compensation groups, and a unit thickness transmittance of the third color film layer.

2. The preparation method of claim 1, wherein the color film layer thickness calculation formula is $H=L1/(L2 \times a)$, wherein the H represents the thickness of the color film layer, the L1 represents the target brightness of the light-emitting element, the L2 represents the test brightness of the light-emitting element, and the a represents a unit thickness transmittance of a color film layer.

3. The preparation method of claim 1, wherein acquiring, in each of the plurality of compensation groups, the test brightness and the target brightness of the first light-emitting element, the test brightness and the target brightness of the second light-emitting element, and the test brightness and the target brightness of the third light-emitting element comprises:

acquiring, in each of the plurality of compensation groups, a sub-test brightness and a sub-target brightness of the first light-emitting element, a sub-test brightness and a sub-target brightness of the second light-emitting element, and a sub-test brightness and a sub-target brightness of the third light-emitting element, under a first pure color picture, a second pure color picture and a third pure color picture respectively; and taking a sum of a sub-test brightness of light-emitting elements of a same color under the first pure color picture, the second pure color picture and the third pure color picture as a test brightness of the light-emitting elements of the same color; and taking a sum of a sub-target brightness of light-emitting elements of a same color under the first pure color picture, the second pure color picture and the third pure color picture as a target brightness of the light-emitting elements of the same color.

4. The preparation method of claim 3, wherein acquiring, under the first pure color picture, the second pure color picture and the third pure color picture, in each of the plurality of compensation groups, the sub-test brightness and the sub-target brightness of the first light-emitting element, the sub-test brightness and the sub-target brightness of the second light-emitting element, and the sub-test brightness and the sub-target brightness of the third light-emitting element, respectively comprises:

S111: controlling the array substrate to display the first pure color picture;

testing to obtain, under the first pure color picture, in each of the plurality of compensation groups, the sub-test brightness and a test color coordinate of the first light-emitting element, the sub-test brightness and a test color coordinate of the second light-emitting element, and the sub-test brightness and a test color coordinate of the third light-emitting element;

acquiring a target brightness and a target color coordinate of a pixel unit preset in the first pure color picture, respectively;

calculating to obtain, under the first pure color picture, in each of the plurality of compensation groups, the sub-target brightness of the first light-emitting element, the sub-target brightness of the second light-emitting element, and the sub-target brightness of the third light-emitting element according to a sub-target brightness calculation formula, the test color coordinate of the first light-emitting element, the test color coordinate of the second light-emitting element, and the test color coordinate of the third light-emitting element in each of the plurality of compensation groups under the first pure color picture, and the target brightness and the target color coordinate of the pixel unit;

S112: obtaining the sub-test brightness and the sub-target brightness of the first light-emitting element, the sub-test brightness and the sub-target brightness of the second light-emitting element and the sub-test brightness and the sub-target brightness of the third light-emitting element in each of the plurality of compensation groups under the second pure color picture according to the steps in the S111; and obtaining the sub-test brightness and the sub-target brightness of the first light-emitting element, the sub-test brightness and the sub-target brightness of the second light-emitting element, and the sub-test brightness and the sub-target brightness of the third light-emitting element in each of the plurality of compensation groups under the third pure color picture according to the method of the S111.

5. The preparation method of claim 4, wherein the sub-target brightness calculation formula comprises:

$$LR=(RY*(L*BX*GY-L*GX*BY-L*BX*Y+L*X*BY+L*GX*Y-L*X*GY))/(BX*GY*Y-GX*BY*Y-BX*RY*Y+RX*BY*Y+GX*RY*Y-RX*GY*Y);$$

$$LG=-(GY*(L*BX*RY-L*RX*BY-L*BX*Y+L*X*BY+L*RX*Y-L*X*RY))/(BX*GY*Y-GX*BY*Y-BX*RY*Y+RX*BY*Y+GX*RY*Y-RX*GY*Y);$$

$$LB=(L*GX*BY*RY-L*RX*BY*GY-L*GX*BY*Y+L*X*BY*GY+L*RX*BY*Y-L*X*BY*RY)/(BX*GY*Y-GX*BY*Y-BX*RY*Y+RX*BY*Y+GX*RY*Y-RX*GY*Y);$$

wherein the LR represents the sub-target brightness of the first light-emitting element, the LG represents the sub-target brightness of the second light-emitting element, the LB represents the sub-target brightness of the third light-emitting element, the RX and RY represent the test color coordinates of the first light-emitting element, the GX and GY represent the test color coordinates of the second light-emitting element, the BX and BY represent the test color coordinates of the third light-emitting element, the L represent a target brightness of a pixel unit under a pure color picture, and the X and Y represent the target color coordinates of the pixel unit under the pure color picture.

6. The preparation method of claim 1, wherein the display panel comprises a display area and a binding area which are sequentially arranged in a first direction, the at least one pixel unit is located in the display area, the at least one pixel unit comprise a first pixel unit and a second pixel unit, and the second pixel unit is located between the first pixel unit and the binding area;
  after the S12, the preparation method further comprises:
    in a case where a thickness ratio of the first color film layer and the second color film layer and a thickness ratio of the second color film layer and the third color film layer corresponding to the first pixel unit, and a thickness ratio of the first color film layer and the second color film layer and a thickness ratio of the second color film layer and the third color film layer corresponding to the second pixel unit are unchanged, adjusting the thicknesses of the first color film layer, the second color film layer and the third color film layer, wherein thickness adjustment amounts of the first color film layer, the second color film layer and the third color film layer in the first pixel unit are respectively less than thickness adjustment amounts of color film layers of a same color in the second pixel unit.

7. The preparation method of claim 6, wherein each of the pixel units are arranged in a matrix in the display area, and a column direction of the matrix is the same as the first direction;
  light-emitting elements of a same color in the pixel units in a same row belong to a same wafer, and a thickness ratio of the first color film layer and the second color film layer is the same as a thickness ratio of the second color film layer and the third color film layer in the pixel units in a same row;
after the S12, the preparation method further comprises:
  in a case where the thickness ratio of the first color film layer and the second color film layer and the thickness ratio of the second color film layer and the third color film layer in each row of the pixel units are unchanged, adjusting the thicknesses of the first color film layer, the second color film layer and the third color film layer in units of rows; and increasing progressively the thickness adjustment amounts of the color film layers of the same color in the first direction.

8. The preparation method of claim 7, wherein a thickness adjustment amount difference of the color film layers of the same color increases progressively in the first direction, and the thickness adjustment amount difference is a difference between a thickness adjustment amount of a color film layer close to a side of the binding area and a thickness adjustment amount of a color film layer away from a side of the binding area in adjacent color film layers of the same color.

9. The preparation method of claim 6, wherein each of the pixel units are arranged in a matrix in the display area, and a column direction of the matrix is the same as the first direction;
  wherein each row of the pixel units comprise at least two sub-pixel unit rows which are sequentially arranged, and each of the at least two sub-pixel unit rows comprises a plurality of pixel units; in a same sub-pixel unit row, light-emitting elements of a same color of the plurality of pixel units belong to a same wafer, and a thickness ratio of the first color film layer and the second color film layer is the same as a thickness ratio of the second color film layer and the third color film layer corresponding to each of the plurality of pixel units; in different sub-pixel unit rows, light-emitting elements of a same color of the plurality of pixel units belong to different wafers, and a thickness ratio of the first color film layer and the second color film layer is different from a thickness ratio of the second color film layer and the third color film layer corresponding to each of the plurality of pixel units;
after the S12, the preparation method further comprises:
  in a case where the thickness ratio of the first color film layer and the second color film layer and the thickness ratio of the second color film layer and the third color film layer in the plurality of pixel units in each of the at least two sub-pixel unit rows are unchanged, adjusting the thicknesses of the first color film layer, the second color film layer and the third color film layer in units of sub-pixel unit rows; and increasing progressively the thickness adjustment amounts of the color film layers of the same color in the first direction.

10. The preparation method of claim 9, wherein a thickness adjustment amount difference of the color film layers of the same color increases progressively in the first direction, and the thickness adjustment amount difference is a difference between a thickness adjustment amount of a color film layer close to a side of the binding area and a thickness adjustment amount of a color film layer away from a side of the binding area in adjacent color film layers of the same color.

11. A display panel, prepared by a preparation method of the display panel,
  wherein the preparation method of the display panel comprises:
    S11: forming a plurality of compensation groups on a substrate to obtain an array substrate; wherein each of the plurality of compensation groups comprises at least one pixel unit, each of the at least one pixel unit comprises a first light-emitting element, a second light-emitting element and a third light-emitting element, and light-emitting colors are different among the first light-emitting element, the second light-emitting element and the third light-emitting element; the plurality of compensation groups comprise at least a first compensation group and a second compensation group, and a brightness difference of light-emitting elements of a same light-emitting color in the first compensation group and the second compensation group under a same gray scale is larger than a preset value;

S12: calculating thicknesses of a first color film layer, a second color film layer and a third color film layer which correspond to each of the plurality of compensation groups, respectively, wherein the first color film layer is located on a light-emitting side of the first light-emitting element, the second color film layer is located on a light-emitting side of the second light-emitting element, and the third color film layer is located on a light-emitting side of the third light-emitting element; and S13: forming the first color film layer on the light-emitting side of the first light-emitting element, forming the second color film layer on the light-emitting side of the second light-emitting element, and forming the third color film layer on the light-emitting side of the third light-emitting element according to the thicknesses of the first color film layer, the second color film layer and the third color film layer obtained in the S12, wherein the display panel comprises a substrate and a plurality of compensation groups located on the substrate, each of the plurality of compensation groups comprises at least one pixel unit, wherein each of the at least one pixel unit comprises a first light-emitting element, a second light-emitting element and a third light-emitting element, and light-emitting colors are different among the first light-emitting element, the second light-emitting element and the third light-emitting element; a first color film layer is arranged on a light-emitting side of the first light-emitting element, a color of the first color film layer is the same as a light-emitting color of the first light-emitting element; a second color film layer is arranged on a light-emitting side of the second light-emitting element, and a color of the second color film layer is the same as a light-emitting color of the second light-emitting element; a third color film layer is arranged on a light-emitting side of the third light-emitting element, and a color of the third color film layer is the same as a light-emitting color of the third light-emitting element; and thicknesses of color film layers of a same color in a same compensation group of the plurality of compensation groups are the same;

wherein the plurality of compensation groups comprise at least a first compensation group and a second compensation group, and a brightness difference of light-emitting elements of a same light-emitting color in the first compensation group and the second compensation group under a same gray scale is larger than a preset value, and a thickness of a color film layer corresponding to the first compensation group is greater than a thickness of color film layers of a same color corresponding to the second compensation group, wherein calculating, in each of the plurality of compensation groups, the thicknesses of the first color film layer located on the light-emitting side of the first light-emitting element, the second color film layer located on the light-emitting layer of the second light-emitting element, and the third color film layer located on the light-emitting side of the third light-emitting element, respectively, comprises:

acquiring, in each of the plurality of compensation groups, a test brightness and a target brightness of the first light-emitting element, a test brightness and a target brightness of the second light-emitting element, and a test brightness and a target brightness of the third light-emitting element;

calculating to obtain the thickness of the first color film layer according to a color film layer thickness calculation formula, the test brightness and the target brightness of the first light-emitting element in each of the plurality of compensation groups, and a unit thickness transmittance of the first color film layer; calculating to obtain the thickness of the second color film layer according to the color film layer thickness calculation formula, the test brightness and the target brightness of the second light-emitting element in each of the plurality of compensation groups, and a unit thickness transmittance of the second color film layer; and calculating to obtain the thickness of the third color film layer according to the color film layer thickness calculation formula, the test brightness and the target brightness of the third light-emitting element in each of the plurality of compensation groups, and a unit thickness transmittance of the third color film layer.

12. The display panel of claim 11, wherein the first light-emitting element, the second light-emitting element, and the third light-emitting element are all micro-LEDs.

13. The display panel of claim 11, wherein a value range of the preset value is greater than 1 jncd.

14. The display panel of claim 11, wherein each of the plurality of compensation groups comprises one pixel unit.

15. The display panel of claim 11, wherein a number of the at least one pixel unit is greater than or equal to 2, light-emitting elements in the same compensation group of the plurality of compensation groups belong to a same wafer, and light-emitting elements in different compensation groups of the plurality of compensation groups belong to different wafers.

16. The display panel of claim 11, wherein light-emitting color of the first light-emitting element, light-emitting color of the second light-emitting element, and light-emitting color of the third light-emitting element are any one of red, green, and blue, respectively, and the light-emitting color of the first light-emitting element, the light-emitting color of the second light-emitting element, and the light-emitting color of the third light-emitting element are different from each other.

17. A display device, comprising a display panel,
wherein the display panel comprises a substrate and a plurality of compensation groups located on the substrate, each of the plurality of compensation groups comprises at least one pixel unit, wherein each of the at least one pixel unit comprises a first light-emitting element, a second light-emitting element and a third light-emitting element, and light-emitting colors are different among the first light-emitting element, the second light-emitting element and the third light-emitting element; a first color film layer is arranged on a light-emitting side of the first light-emitting element, a color of the first color film layer is the same as a light-emitting color of the first light-emitting element; a second color film layer is arranged on a light-emitting side of the second light-emitting element, and a color of the second color film layer is the same as a light-emitting color of the second light-emitting element; a third color film layer is arranged on a light-emitting side of the third light-emitting element, and a color of the third color film layer is the same as a light-emitting color of the third light-emitting element; and thicknesses of color film layers of a same color in a same compensation group of the plurality of compensation groups are the same;

wherein the plurality of compensation groups comprise at least a first compensation group and a second compensation group, and a brightness difference of light-emitting elements of a same light-emitting color in the first compensation group and the second compensation group under a same gray scale is larger than a preset value, and a thickness of a color film layer corresponding to the first compensation group is greater than a thickness of color film layers of a same color corresponding to the second compensation group, wherein the display panel is prepared by a preparation method of the display panel, wherein the preparation method of the display panel comprises:

S11: forming a plurality of compensation groups on a substrate to obtain an array substrate; wherein each of the plurality of compensation groups comprises at least one pixel unit, each of the at least one pixel unit comprises a first light-emitting element, a second light-emitting element and a third light-emitting element, and light-emitting colors are different among the first light-emitting element, the second light-emitting element and the third light-emitting element the plurality of compensation groups comprise at least a first compensation group and a second compensation group, and a brightness difference of light-emitting elements of a same light-emitting color in the first compensation group and the second compensation group under a same gray scale is larger than a preset value;

S12: calculating thicknesses of a first color film layer, a second color film layer and a third color film layer which correspond to each of the plurality of compensation groups, respectively, wherein the first color film layer is located on a light-emitting side of the first light-emitting element, the second color film layer is located on a light-emitting side of the second light-emitting element, and the third color film layer is located on a light-emitting side of the third light-emitting element; and S13: forming the first color film layer on the light-emitting side of the first light-emitting element, forming the second color film layer on the light-emitting side of the second light-emitting element, and forming the third color film layer on the light-emitting side of the third light-emitting element according to the thicknesses of the first color film layer, the second color film layer and the third color film layer obtained in the S12, wherein calculating, in each of the plurality of compensation groups, the thicknesses of the first color film layer located on the light-emitting side of the first light-emitting element, the second color film layer located on the light-emitting layer of the second light-emitting element, and the third color film layer located on the light-emitting side of the third light-emitting element, respectively, comprises:

acquiring, in each of the plurality of compensation groups, a test brightness and a target brightness of the first light-emitting element, a test brightness and a target brightness of the second light-emitting element, and a test brightness and a target brightness of the third light-emitting element;

calculating to obtain the thickness of the first color film layer according to a color film layer thickness calculation formula, the test brightness and the target brightness of the first light-emitting element in each of the plurality of compensation groups, and a unit thickness transmittance of the first color film layer; calculating to obtain the thickness of the second color film layer according to the color film layer thickness calculation formula, the test brightness and the target brightness of the second light-emitting element in each of the plurality of compensation groups, and a unit thickness transmittance of the second color film layer; and calculating to obtain the thickness of the third color film layer according to the color film layer thickness calculation formula, the test brightness and the target brightness of the third light-emitting element in each of the plurality of compensation groups, and a unit thickness transmittance of the third color film layer.

18. The display device of claim 17, wherein a value range of the preset value is greater than 1 jncd.

19. The display device of claim 17, wherein a number of the at least one pixel unit is greater than or equal to 2, light-emitting elements in the same compensation group of the plurality of compensation groups belong to a same wafer, and light-emitting elements in different compensation groups of the plurality of compensation groups belong to different wafers.

* * * * *